(12) United States Patent
Jeon

(10) Patent No.: US 11,322,486 B2
(45) Date of Patent: May 3, 2022

(54) DISPLAY DEVICE

(71) Applicant: LG ELECTRONICS INC., Seoul (KR)

(72) Inventor: Kiseong Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/968,065

(22) PCT Filed: Jul. 5, 2018

(86) PCT No.: PCT/KR2018/007641
§ 371 (c)(1),
(2) Date: Aug. 6, 2020

(87) PCT Pub. No.: WO2019/156294
PCT Pub. Date: Aug. 15, 2019

(65) Prior Publication Data
US 2021/0057393 A1    Feb. 25, 2021

(30) Foreign Application Priority Data

Feb. 7, 2018  (KR) ........................ 10-2018-0015246

(51) Int. Cl.
*H01L 25/075*   (2006.01)
*H01L 33/50*    (2010.01)
*H01L 33/62*    (2010.01)

(52) U.S. Cl.
CPC ........ *H01L 25/0753* (2013.01); *H01L 33/505* (2013.01); *H01L 33/62* (2013.01); *H01L 2933/0041* (2013.01); *H01L 2933/0066* (2013.01)

(58) Field of Classification Search
CPC ... H01L 25/0753; H01L 33/505; H01L 33/62; H01L 2933/0041; H01L 2933/0066; H01L 33/38; H01L 33/40; H01L 27/156
See application file for complete search history.

(56) References Cited

U.S. PATENT DOCUMENTS

| | | | |
|---|---|---|---|
| 2010/0259812 A1 | 10/2010 | Chang | |
| 2013/0134470 A1* | 5/2013 | Shin | ........................ H01L 33/62 257/99 |
| 2017/0148771 A1* | 5/2017 | Cha | ........................ H05K 3/325 |

FOREIGN PATENT DOCUMENTS

| | | |
|---|---|---|
| KR | 10-1058880 B1 | 8/2011 |
| KR | 10-2016-0121724 A | 10/2016 |
| KR | 10-2017-0022755 A | 3/2017 |
| KR | 10-2017-0022756 A | 3/2017 |
| KR | 10-2017-0024905 A | 3/2017 |

(Continued)

*Primary Examiner* — Victor A Mandala
(74) *Attorney, Agent, or Firm* — Birch, Stewart, Kolasch & Birch, LLP

(57) ABSTRACT

Discussed is a display device including a lower substrate on which a lower electrode is disposed; a flat layer disposed on the lower substrate and having a plurality of holes; a plurality of light-emitting devices respectively disposed in of the plurality of holes; a magnetic portion disposed on the lower substrate and having an magnetic property; and a reaction portion disposed at each of the plurality of light-emitting devices and forming an attractive force with the magnetic portion, wherein a magnetization direction of the magnetic portion is perpendicular to the lower substrate.

19 Claims, 15 Drawing Sheets

(56) References Cited

FOREIGN PATENT DOCUMENTS

| KR | 10-20170024905 | * | 3/2017 | ..................... 33/14 |
| --- | --- | --- | --- | --- |
| KR | 10-20170102782 | * | 9/2017 | ..................... 33/38 |
| KR | 10-2017-0133717 A | | 12/2017 | |
| WO | WO-2017150910 A1 | * | 9/2017 | ........... H01L 27/156 |
| WO | WO-2018206891 A | * | 11/2018 | ............. H01L 33/62 |

* cited by examiner

DISPLAY DEVICE

CROSS REFERENCE TO RELATED APPLICATIONS

This application is the National Stage filing under 35 U.S.C. 371 of International Application No. PCT/KR2018/007641, filed on Jul. 5, 2018, which claims the benefit of earlier filing date and right of priority to Korean Application No. 10-2018-0015246, filed on Feb. 7, 2018, the contents of all these applications are all hereby incorporated by reference herein in their entirety.

TECHNICAL FIELD

The present disclosure relates to a display device.

BACKGROUND ART

Recently, a flat panel display device having excellent features such as thin and light designs, and low power consumption has been widely developed and used in various fields.

A liquid crystal display (LCD) is widely used in various areas, from small-sized portable terminals to large-sized televisions, because of its high display quality and features such as thin and lightweight designs, and low power consumption.

An organic light emitting diode (OLED) display device (hereinafter, "OLED") is a device that emits light. Electrons and holes (electron holes) are injected into an emissive (or light-emitting) layer formed between a cathode which is an electron injection electrode and an anode which is a hole injection electrode. As the electrons and holes recombine, electron-hole pairs are created, forming an exciton. The emissive layer emits light as the excited state decays. Such an OLED device has advantages such as flexible nature, color capability, and low power consumption. More specifically, the OLED device can be formed even on a flexible substrate such as plastic, has excellent color naturalness due to its characteristics of self-emission and can be driven at a low voltage (less than 10V).

However, a liquid crystal displays (LCD) has some drawbacks, such as a not-so-fast response time and high energy consumption as it lowers efficiency of backlight unit with high efficiency. In the case of an organic light emitting diode (OLED), organics have much shorter lifetimes of up to around 2 years as they are vulnerable to reliability, and have low mass-production yield.

In order to obviate these problems, a new display device in which micro LEDs are aligned in each pixel region (or area) has been developed.

However, in a large display device using such micro LEDs, there is a difficulty in aligning each of the micro LEDs to a lower wiring on which the respective pixel regions are located, due to their small size.

In the related art, micro LEDs are self-aligned to a lower wiring by a capillary force. However, as the capillary force is too weak, a possibility of self-alignment is low. As a result, many micro LEDs are wasted, which leads to a decrease in yield.

Further, in the related art, one micro LED should be aligned in one pixel region, but a plurality of micro LEDs may be arranged in one pixel region.

DISCLOSURE

Technical Problem

An aspect of the present disclosure is to provide a display device having a plurality of light-emitting devices aligned on a substrate in an accurate and efficient manner.

Technical Solution

Embodiments disclosed herein provide a display device that may include a lower substrate on which a lower electrode is disposed, a flat layer disposed on the lower substrate and having a plurality of holes, a plurality of light-emitting devices disposed in each of the plurality of holes, a magnetic portion disposed on the lower substrate and having magnetic properties, and a reaction portion disposed at each of the light-emitting devices and forming an attractive force with the magnetic portion. A magnetization direction of the magnetic portion may be perpendicular to the lower substrate.

In one embodiment, the magnetic portion may be made of a ferromagnetic material, and the reaction portion may be made of a paramagnetic material.

In one embodiment, each of the light-emitting devices may include a first electrode electrically connected to the lower electrode and having a plurality of layers, a first conductive semiconductor layer disposed on the first electrode, an active layer disposed on the first conductive semiconductor layer, and a second conductive semiconductor layer disposed on the active layer. The reaction portion may be any one of the plurality of layers constituting the first electrode.

In one embodiment, the first electrode may include a first metal layer in contact with the first conductive semiconductor layer, and a second metal layer in contact with the lower electrode. The reaction portion may be disposed between the first electrode layer and the second electrode layer.

In one embodiment, the reaction portion may be made of any one of Ni, Fe, Mo, and Co, or an Ni—Mo—Fe alloy or an Ni—Cr—Mo—Fe alloy.

In one embodiment, resistivity of the first and second metal layers may be less than resistivity of the reaction portion.

In one embodiment, the lower electrode may include a plurality of layers, and the magnetic portion may be any one of the plurality of layers constituting the lower electrode.

In one embodiment, the magnetic portion may be made of an Sm—Co alloy.

In one embodiment, a thickness of the magnetic portion may be 20 to 1000 nm.

In one embodiment, the present disclosure may further include a flat layer covering the lower substrate and having a plurality of holes, and the magnetic portion may be disposed to overlap a corresponding hole of the plurality of holes.

Advantageous Effects

The embodiments of the present disclosure may provide at least one or more of the following benefits or advantages. A possibility that two or more light-emitting devices are arranged in one pixel region may be reduced due to mating (or matching) of a light-emitting structure and a substrate.

A defective or improper electrical connection between a light-emitting device and a lower wiring may be reduced even when the light-emitting structure is rotated on an axis perpendicular to a lower substrate due to a shape of the light-emitting structure.

In addition, a magnetic portion and a reaction portion are provided on the lower substrate and the light-emitting device, thereby increasing a possibility of proper alignment of the light-emitting device using a capillary force and a magnetic force.

Also, a high-speed screen may be implemented with a fast response speed by disposing an inorganic light-emitting device in a pixel region.

Further, a separate backlight unit is not required, thereby providing excellent luminance and high efficiency.

Moreover, the light-emitting device is an inorganic material, which is advantageous in terms of a long lifespan.

Furthermore, the light-emitting devices may be disposed in the unit of pixels, making it suitable to be implemented as an active type.

BEST MODE OF CARRYING OUT EMBODIMENTS

Figure 1:
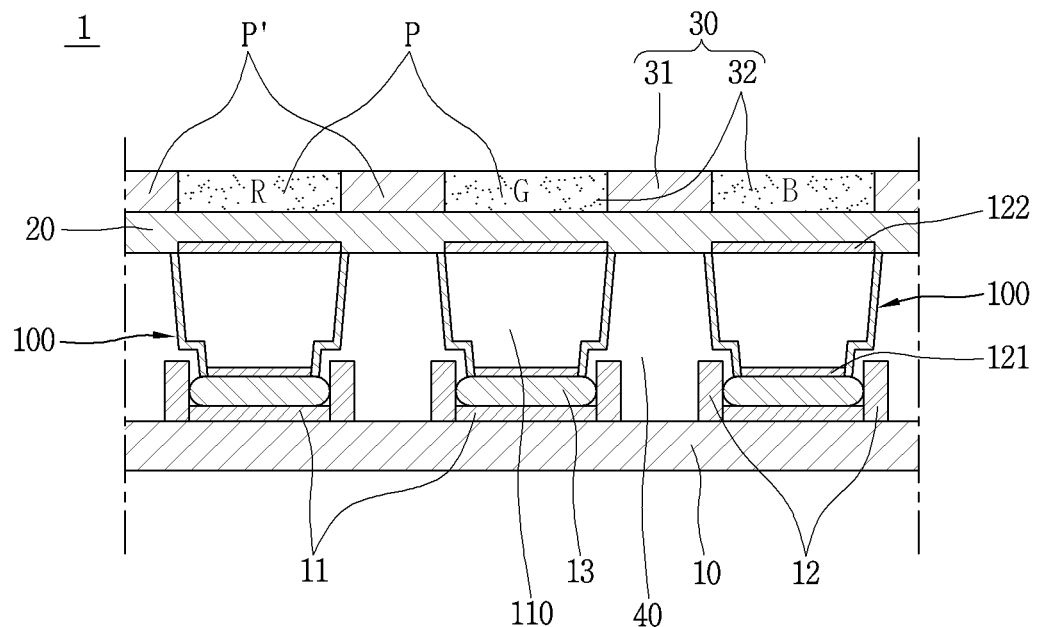
FIG. 1 is a cross-sectional view of a display device according to a first embodiment of the present disclosure.

The advantages and features of the present disclosure will become better understood with reference to the following detailed description of embodiments taken in conjunction with the accompanying drawings. Although preferred embodiments have been depicted and described in detail herein, it will be apparent to those skilled in the relevant art that various modifications, additions, substitutions and the like can be made without departing from the spirit of the disclosure, and these are, therefore, considered to be within the scope of the disclosure, as defined in the following claims. Like reference numerals refer to like components throughout the specification.

Spatially relative terms, such as "beneath", "below", "lower", "above", "upper", and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented at other orientations, and the spatially relative descriptors used herein are interpreted accordingly.

In will be understood that the terminology used herein is for the purpose of describing the embodiments herein and is not intended to limit the present disclosure. A singular representation may include a plural representation as far as it represents a definitely different meaning from the context. Terms such as "comprises" and/or "comprising" used herein should be understood that they are intended to indicate the existence of a feature, a number, a step, a constituent element, a component or a combination thereof disclosed in the specification, and it may also be understood that the existence or additional possibility of one or more other features, numbers, steps, constituent elements, components or combinations thereof are not excluded in advance.

In the drawings, thickness or dimensions of each layer are exaggerated, omitted, or schematically illustrated for the sake of convenience and clarity. In addition, dimensions of constituent components and areas do not entirely reflect the actual dimensions and areas.

In addition, angles and directions mentioned for the purpose of describing a structure of a display device in the embodiments disclosed herein are based on those illustrated in the drawings. In describing the structures constituting the display device in the specification, if reference points and positional relationships with respect to angles are not explicitly referred to, reference is made to the related drawings.

Hereinafter, the embodiments will be described in more detail with reference to the drawings.

Figure 2:
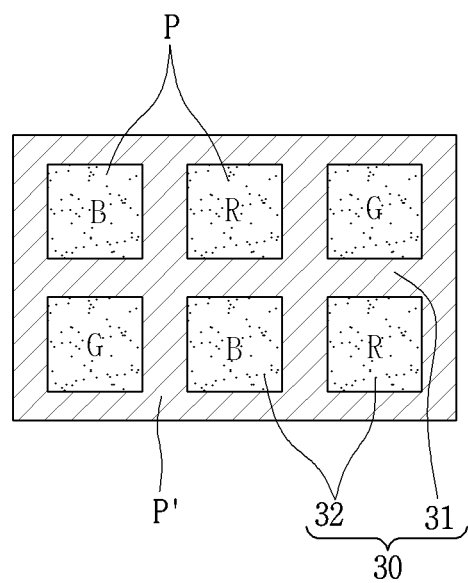
FIG. 2 is a planar view of the display device according to the first embodiment illustrated in FIG. 1.
Figure 3:
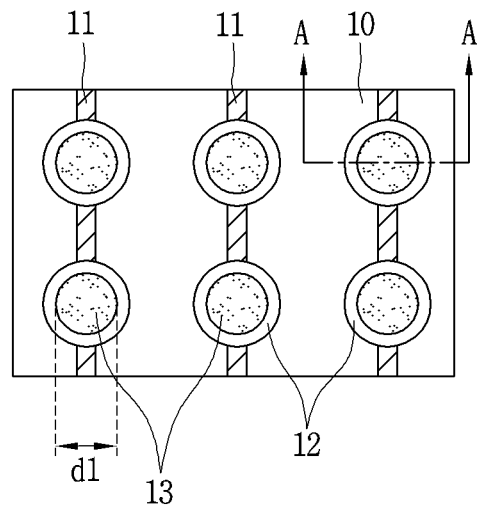
FIG. 3 is a planar view of a lower substrate according to the first embodiment of the present disclosure.
Figure 4:
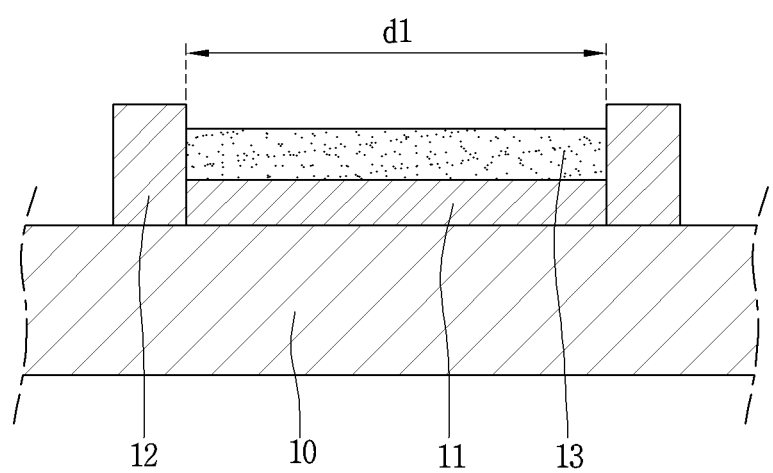
FIG. 4 is a cross-sectional view taken along line "A-A" of the lower substrate illustrated in FIG. 3.

FIG. 1 is a cross-sectional view of a display device according to a first embodiment of the present disclosure, FIG. 2 is a planar view of the display device according to the first embodiment illustrated in FIG. 1, FIG. 3 is planar view of a lower substrate according to the first embodiment of the present disclosure, and FIG. 4 is a cross-sectional view taken along line "A-A" of the lower substrate illustrated in FIG. 3.

Referring to FIGS. 1 to 4, a display device 1 according to the first embodiment includes a lower substrate 10 on which lower wiring 11 is disposed, and at least two light-emitting devices (or elements) 100 each having a first electrode 121 electrically connected to the lower wiring 11 and a light-emitting structure 110 configured to generate light.

In addition, the display device 1 according to the first embodiment further includes a second electrode 122 located on a second conductive semiconductor layer 113, an upper wiring 20 electrically connected to the second electrode 122, and a color substrate 30 disposed on the light-emitting device 100 to convert a wavelength of light generated from the light-emitting device 100.

The lower substrate 10 may be implemented as a film made of an insulating material. For example, the lower substrate 10 may be made of a transparent glass material, or may be made of a transparent plastic or a polymer film having high flexibility.

The lower wiring 11 is disposed on the lower substrate 10. The lower wiring 11 is electrically connected to the light-emitting device 100 to supply driving power to the light-emitting device 100. The lower wiring 11 located on the lower substrate 10 is provided at a position that corresponds to the light-emitting device 100. More specifically, the lower wiring 11 is disposed in a line shape on a plane (or flat surface), as shown in FIG. 3, so as to supply driving power to a plurality of light-emitting devices 100. The light-emitting devices 100 are arranged with a constant pitch on the lower wiring 11 that is disposed in the line shape. Alternatively, the lower wiring 11 is disposed in a dot shape on a plane.

The lower wiring 11 may include a conductive material, and include a metal selected from, such as In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or an alloy thereof, and may be formed as a single layer or multiple layers. Further, the lower wiring 11 may be made of a light transmissive material that includes at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, Ni/$IrO_x$/Au, and Ni/$IrO_x$/Au/ITO.

The lower wiring 11 is formed such that the conductive material described above is coated or deposited on the lower substrate 10 by using a deposition method such as sputtering. Then, a metal layer may be patterned by a photolithography process and an etching process using a mask.

The lower wirings 11 may be arranged to intersect each other and a switching element (not shown) may be located at a point of the intersection. The lower wiring 11 may be disposed in consideration of a pixel region (or area) P, which will be described hereinafter.

The lower wiring 11 is electrically connected to the first electrode 121 of the light-emitting device 100, and a metal bonding layer 13 is provided to reinforce adhesion between the lower wiring 11 and the first electrode 121.

The metal bonding layer 13 is disposed on the lower wiring 11 to correspond to each of the pixel regions P in which the respective light-emitting devices 100 are located. The metal bonding layer 13 is used for joining the lower wiring 11 and the first electrode 121 together.

In addition, the metal bonding layer 13 may be made of a material that produces a capillary force on the first electrode 121. The plurality of light-emitting devices 100 is aligned on the lower wiring 11 to correspond to the respective pixel regions P by the capillary force acting between the metal bonding layer 13 and the first electrode 121.

In detail, the lower substrate 10 on which the metal bonding layer 13 is disposed is put into a solution containing a larger number of light-emitting devices 100 than that of the pixel regions P while applying vibration. Then, the light-emitting devices 100 are self-aligned by the capillary force between the metal bonding layer 13 and the first electrode 121.

When heat is applied to the metal bonding layer 13, the metal bonding layer 13 is melted, allowing the first electrode 121 and the lower wiring 11 to be joined together. The metal bonding layer 13 has a melting point temperature of 45° C. to 300° C. A metal solder having 150° C. to 300° C. of melting point temperature is used to withstand driving conditions of the display device and temperature of post-processes. Thus, self-alignment is performed at the melting point temperature of the metal bonding layer 13. More preferably, the melting point temperature of the metal bonding layer 13 is lower than a melting point temperature of the first electrode 121.

The metal bonding layer 13 includes a conductive material. For example, the metal bonding layer 13 may be at least one element of Sn, Ag, Cu, Pb, Al, Bi, Cd, Fe, In, Ni, Sb, Zn, Co, and Au, or a component of these elements with eight-component systems or less. More preferably, the metal bonding layer 13 may be at least one element of Cu, Pb, Al, Fe and Ni, or a component of these elements.

The metal bonding layer 13 is formed on the lower wiring 11 by using a deposition method such as sputtering. Then, the metal layer may be patterned by a photolithography process and an etching process using a mask.

When the metal bonding layer 13 is melted, the metal bonding layer 13 disposed on the lower wiring 11 expands more than a set or predetermined size. As a result, two or more light-emitting devices 100 may be coupled to the metal bonding layer 13. In order to prevent this, a positioning partition wall 12 is provided at an upper portion of the lower substrate 10.

The positioning partition wall 12 defines a space in which the metal bonding layer 13 is accommodated. In addition, the positioning partition wall 12 determines a position in which the first electrode 121 of the light-emitting device 100 is aligned. The positioning partition wall 12 serves as a wall that prevents the metal bonding layer 13 from expanding beyond a predetermined size. In addition, the positioning partition wall 12 holds the shape of the metal bonding layer 13. Accordingly, the metal bonding layer 13 has a shape corresponding to a shape of the light-emitting device 100, thereby facilitating alignment of the light-emitting device 100, and preventing two or more light-emitting devices from being coupled to one metal bonding layer 13.

Moreover, a central region S1 of the light-emitting structure 110 is inserted in a space defined by the positioning partition wall 12. The space defined by the positioning partition wall 12 has a shape that allows the central region S1 to be inserted. When the central region S1 is inserted into the space defined by the positioning partition wall 12, the likelihood of proper (or successful) alignment of the light-emitting device 100 is increased. A center of the light-emitting device 100 is aligned with a center of the metal bonding layer 13 even though the light-emitting device 100 is brought into contact with the metal bonding layer 130 by a capillary force due to a mating (or matching) of the central region S1 with the positioning partition wall 12.

In more detail, the positioning partition wall 12 has a shape that accommodates a part (or portion) of the lower wiring 11 and protrudes upward than the lower wiring 11. For example, as illustrated in FIG. 4, the positioning partition wall 12 may be a wall protruding upward from the lower substrate 10. Alternatively, the positioning partition wall 12 may be recessed downward from an upper portion of the lower substrate 10. However, considering arrangement of the lower wiring 11 on the lower substrate 10, the positioning partition wall 12 may have a wall shape protruding from the lower substrate 10.

In particular, referring to FIG. 3, the positioning partition wall 12 is disposed on the lower substrate 10 at a position corresponding to each of the pixel regions P in which the respective light-emitting devices 100 are to be located, so as to determine a region where the first electrode 121 and the metal bonding layer 13 are joined together. The metal bonding layer 13 is accommodated in a space defined by the positioning partition wall 12 on a plane.

The positioning partition wall 12 has a shape of a closed space on a plane. The positioning partition wall 12 is disposed to surround the metal bonding layer 13 on a plane. The positioning partition wall 12 has a ring shape on a plane.

More specifically, in order to prevent misalignment of the light-emitting device 100, an inner space defined by the positioning partition wall 12 is formed to correspond to the central region S1 of the light-emitting structure 110, which will be described hereinafter. The inner space defined by the positioning partition wall 12 has a circular shape. A diameter d1 of the inner space defined by the positioning partition wall 12 is greater than a diameter d2 of the central region S1. The diameter d1 of the inner space defined by the positioning partition wall 12 may correspond to 90% to 120% of the diameter d2 of the central region S1. As another example, the positioning partition wall 12 is continuously (or consecutively) disposed on a boundary line that surrounds the central region S1, when viewed from above.

The positioning partition wall 12 is made of a resin material having electrical insulation properties.

The upper wiring 20 supplies driving (or electric) power to the light-emitting device 100. The upper wiring 20 supplies electric power of opposite polarity to the lower wiring 11.

In detail, the upper wiring 20 is electrically connected to the second electrode 122 of the light-emitting device 100. The upper wiring 20 is located on the second electrode 122. The upper wiring 20 is disposed to at least vertically overlap the second electrode 122. In addition, the upper wiring 20 is disposed in a line shape on a plane.

The upper wiring 20 may include a conductive material, and include a metal selected from, such as In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or an alloy thereof, and may be formed as a single layer or multiple layers. More preferably, the upper wiring 20 may be made of a material that transmits light generated from the light-emitting device 100 located below. For example, the upper wiring 20 may include at least one of ITO, IZO (In—ZnO), GZO (Ga—ZnO), AZO (Al—ZnO), AGZO (Al—Ga ZnO), IGZO (In—Ga ZnO), IrO$_x$, RuO$_x$, RuO$_x$/ITO, Ni/IrO$_x$/Au, and Ni/IrO$_x$/Au/ITO.

The upper wiring 20 is formed such that the conductive material described above is coated or deposited on the second electrode 122 using a deposition method such as sputtering. Then, the metal layer may be patterned via a photolithography process and an etching process using a mask.

In order to arrange the upper wiring 20 having the line shape, a molding material 40 is filled in an air gap (or void) between each of the light-emitting devices 100. An upper surface of the light-emitting device 100 is flattened (or planarized) by the molding material 40. The molding material 40 is made of transparent silicone that transmits light, for example.

Referring to FIG. 2, the color substrate 30 is disposed on the light-emitting device 100 so as to convert the wavelength of light generated by the light-emitting device 100. In addition, one region of the color substrate 30 shields light, and another region transmits light, so as to be divided into a plurality of pixel regions P and non-pixel regions P'.

The plurality of pixel regions P may be arranged in a matrix type having rows and columns. A black matrix 31 is disposed on the non-pixel regions P' of the color substrate 30 with a constant interval to define the pixel regions P.

For example, the color substrate 30 may include the black matrix 31 and a color filter 32.

The black matrix 31 is formed on the color substrate 30. The black matrix 31 divides the region of the color substrate 30 into a plurality of pixel regions P where the color filters 32 are to be provided, and prevents light interference and external light reflection between adjacent pixel regions P.

A plurality of color filters 32 (R, G, B) is located at the pixel regions P that correspond to a space between the black matrices 31.

The color filters 32 are provided in the pixel regions P divided by the black matrix 31 to be classified into red (R), green (G), and blue (B), so as to transmit red light, green light, and blue light, respectively. The red, green, and blue color filters 32 (R, G, and B) for representing colors may be arranged in a stripe shape along respective column directions.

The black matrix 31 may include a material that blocks light, for example, a non-light transmitting synthetic resin.

The color filter 32 may be disposed to vertically overlap the plurality of light-emitting devices 100 (see FIG. 1). Further, the black matrix 31 may be disposed without vertically overlapping the plurality of light-emitting devices 100. Accordingly, most of the light generated from the light-emitting devices 100 is emitted to the outside through the color filter 32, thereby improving efficiency and brightness of the display device 1.

The color filter 32 may include a phosphor that converts the wavelength of light generated in the light-emitting devices 100. For example, at least one phosphor may be selected according to a wavelength of light to be realized (or achieved).

Such a phosphor may be one of a blue light emitting phosphor, a blue-green light emitting phosphor, a green light emitting phosphor, a yellow-green light emitting phosphor, a yellow light emitting phosphor, a yellow-red light emitting phosphor, an orange light emitting phosphor, and a red light emitting phosphor according to the wavelength of light emitted from the light-emitting device 100.

In other words, the phosphor may be excited by light having first light emitted from the light-emitting device 100 to generate second light.

For example, when the light-emitting device 100 is a blue light-emitting diode and a phosphor is a yellow phosphor, the yellow phosphor may be excited by blue light to emit yellow light.

Such phosphors may be known phosphors, such as YAG-based, TAG-based, sulfide-based, silicate-based, aluminate-based, nitride-based, carbide-based, nitridosilicate-based, borate-based, fluoride-based, and phosphate-based phosphors.

Alternatively, the color substrate 30 may not be provided, but each of the light-emitting devices 100 may be configured to emit red, green, and blue light instead. However, in this case, it may be difficult to align each of the light-emitting devices 100 in a manner of corresponding to a color of the respective pixel region P.

Figure 5:
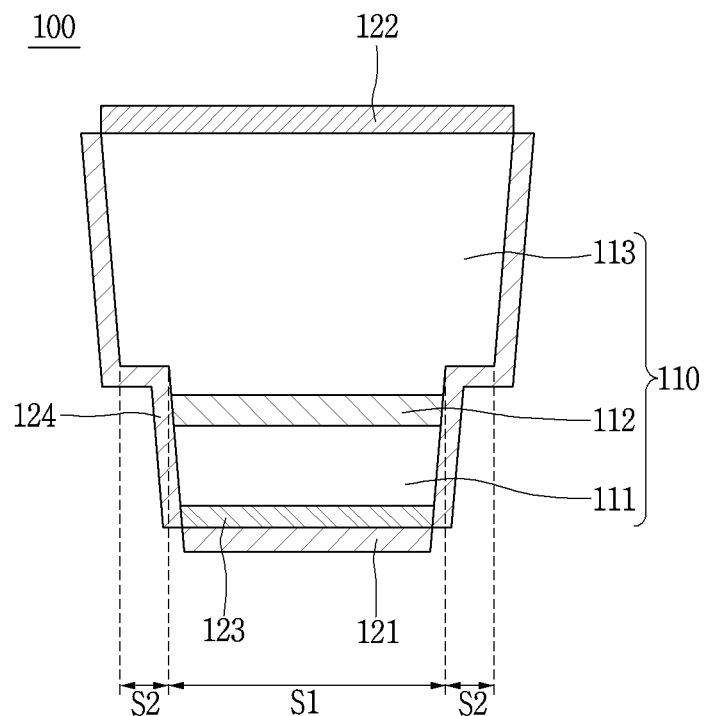
FIG. 5 is a cross-sectional view of a light-emitting device according to the first embodiment of the present disclosure.
Figure 6:
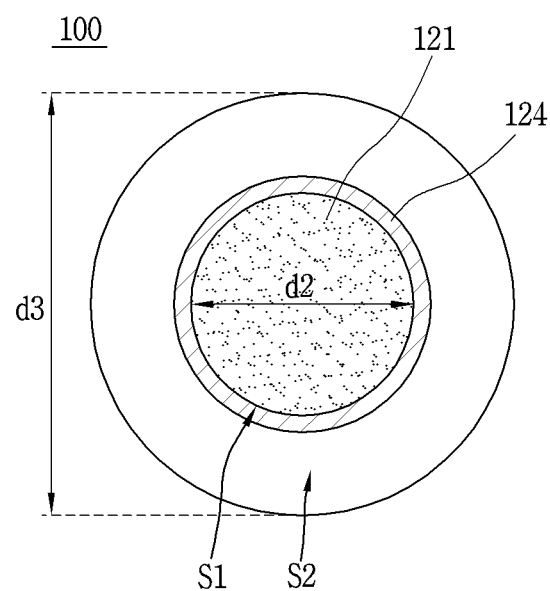
FIG. 6 is a planar view of the light-emitting device according to the first embodiment of the present disclosure.

FIG. 5 is a cross-sectional view of a light-emitting device according to the first embodiment of the present disclosure, and FIG. 6 is a planar view of the light-emitting device according to the first embodiment of the present disclosure.

The plurality of light-emitting devices 100 is located at the lower wiring 11 to correspond to the respective pixel regions P. In detail, the light-emitting devices 100 are aligned and adhered onto the respective metal bonding layers 13 located corresponding to each pixel region P.

The light-emitting device 100 includes the first electrode 121, the second electrode 122, and the light-emitting structure 110 that generates light.

The light-emitting device 100 may be an inorganic semiconductor selected from semiconductor materials having a composition formula $In_xAl_yGa_{1-x-y}N$ ($0 \leq x \leq 1$, $0 \leq y \leq 1$, $0 \leq x+y \leq 1$).

A Liquid Crystal Display (LCD) has some drawbacks, for example, a response time is not fast, causing huge power consumption as it lowers efficiency of a backlight unit having high efficiency. Further, Organic Light Emitting Diodes (OLEDs) have shorter lifetimes of up to around 2 years, and have very low mass-production yield.

In this embodiment, a high-speed screen with a fast response speed may be realized by disposing the inorganic light-emitting devices 100 in the pixel regions P. In addition, a backlight unit is not separately required, thereby achieving excellent luminance (or brightness) and high efficiency.

Further, the light-emitting device 100 is an inorganic material, and thereby to have a long lifespan. Moreover, the light-emitting devices 100 may be arranged in the unit of pixels, making it suitable for implementing as an active type.

The light-emitting device 100 may emit an ultraviolet ray (UV) or blue light. In the case of light having a short wavelength, luminance is excellent, thereby achieving a light of high luminance with a low voltage.

The light-emitting device 100 may be formed using a metal organic chemical vapor deposition (MOCVD), chemical vapor deposition (CVD), plasma chemical vapor deposition (PECVD), Molecular Beam Epitaxy (MBE), Hydride Vapor Phase Epitaxy (HVPE), sputtering, and the like, but the method is not limited thereto.

For example, the light-emitting structure 110 includes a first conductive semiconductor layer 111, an active layer 112 disposed on the first conductive semiconductor layer 111, and the second conductive semiconductor layer 113 located on the active layer 112.

The first conductive semiconductor layer 111 may be formed of a semiconductor compound and be doped with a first conductive dopant. For example, the first conductive semiconductor layer 111 may be implemented as an n-type semiconductor layer to provide electrons to the active layer 112. The first conductive semiconductor layer 111 may be selected from semiconductor materials, such as GaN, AlN, AlGaN, InGaN, InN, InAlGaN, and AlInN, that have a composition formula of $In_xAl_yGa_{1-x-y}N$ ($0 \leq x \leq 1$, $0 \leq y \leq 1$, $0 \leq x+y \leq 1$), and may be doped with a n-type dopant, such as Si, Ge, Sn, Se, and Te.

The active layer 112 may be disposed on the first conductive semiconductor layer 111. The active layer 112 may have any one of a single quantum well structure, a multiple quantum well structure, a quantum-wire structure, and a quantum dot structure by using a compound semiconductor material of Group 3 to 5 elements.

When the active layer 112 consists of a quantum well structure, it may have a single or multiple quantum well structure with a well layer having a composition formula of $In_xAl_yGa_{1-x-y}N$ ($0 \leq x \leq 1$, $0 \leq y \leq 1$, $0 \leq x+y \leq 1$) and a barrier layer having a composition formula of $In_aAl_bGa_{1-a-b}N$ ($0 \leq a \leq 1$, $0 \leq b \leq 1$, $0 \leq a+b \leq 1$), for example. The well layer may be formed of a material having a smaller band gap than the barrier layer.

In addition, when the active layer 112 has a multiple quantum well structure, each of well layers (not shown) may have a different In content and a different band gap, which will be described hereinafter with reference to FIG. 2.

A conductive clad layer (not shown) may be formed on and/or beneath the active layer 112. The conductive clad layer (not shown) may be implemented as a semiconductor, and have a larger band gap than the active layer 112. For example, the conductive clad layer (not shown) may include AlGaN.

The second conductive semiconductor layer 113 may be formed of a semiconductor compound to inject holes into the active layer 112, and be doped with a second conductive dopant. For example, the second conductive semiconductor layer 113 may be implemented as a p-type semiconductor layer. The second conductive semiconductor layer 113 may be selected from semiconductor materials, such as GaN, AlN, AlGaN, InGaN, InN, InAlGaN, and AlInN, that have a composition formula of $In_xAl_yGa_{1-x-y}N$ ($0 \leq x \leq 1$, $0 \leq y \leq 1$, $0 \leq x+y \leq 1$), and may be doped with a p-type dopant such as Mg, Zn, Ca, Sr, and Ba.

Meanwhile, an intermediate layer (not shown) may be formed between the active layer 112 and the second conductive semiconductor layer 113. The intermediate layer (not shown) may prevent electrons, injected into the active layer 112 from the first conductive semiconductor layer 111, from flowing to the second conductive semiconductor layer 113 without being recombined with holes at the active layer 112 when a high current is applied. The intermediate layer (not shown) has a relatively larger band gap than the active layer 112, and thus the electrons injected from the first conductive semiconductor layer 111 may be prevented from being injected into the second conductive semiconductor layer 113 without being recombined with the holes at the active layer 112. Accordingly, the possibility of recombination of electrons and holes at the active layer 112 may be increased and a leakage current may be prevented.

In addition, the first conductive semiconductor layer 111 may be implemented as a p-type semiconductor layer, the second conductive semiconductor layer 113 may be implemented as an n-type semiconductor layer, and a third semiconductor layer (not shown) including an n-type or a p-type semiconductor layer opposite to polarity of the second conductive semiconductor layer 113 may be formed on the second conductive semiconductor layer 113. Accordingly, the light-emitting device may have at least one of np, pn, npn, and pnp junction structures. The light-emitting device 100 of this embodiment is configured as a vertical type in which electrodes are formed at upper and lower portions of the light-emitting structure 110, the first conductive semiconductor layer 111 is implemented as a p-type semiconductor layer, and the second conductive semiconductor layer 113 is implemented as an n-type semiconductor layer.

Meanwhile, the first electrode 121 electrically connected to the first conductive semiconductor layer 111 may be disposed on the first conductive semiconductor layer 111. For example, the first electrode 121 may be formed at a lower portion of the first conductive semiconductor layer 111. The first electrode 121 and the lower wiring 11 are adhered together by the metal bonding layer 13.

Further, the second electrode 122 electrically connected to the second conductive semiconductor layer 113 may be disposed on the second conductive semiconductor layer 113. More specifically, the second electrode 122 is located on the second conductive semiconductor layer 113.

The first electrode 121 and the second electrode 122 may be formed by a deposition method such as sputtering. However, the present disclosure is not limited thereto.

Meanwhile, the first electrode 121 and the second electrode 122 may be made of a conductive material, and may include a metal selected from, such as In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or an alloy thereof, and may be formed as a single layer or multiple layers. However, the present disclosure is not limited thereto. More preferably, the first electrode 121 is made of any one element of Au, Pt, and Ag, or an alloy thereof.

In addition, a bonding layer (not shown) that joins the first electrode 121 and the first conductive semiconductor layer 111 together is formed between the first electrode 121 and the first conductive semiconductor layer 111. The bonding layer (not shown) may include any one of a PbSn alloy, an AuGe alloy, an AuBe alloy, an AuSn alloy, an SnIn alloy, and a PdIn alloy.

Moreover, the first electrode 121 may further include a reflective layer 123 that is conductive and reflects light incident from the active layer 112.

When light generated in the active layer 112 travels to the lower substrate 10, the light is reflected by the reflective layer 123 without being absorbed by the first electrode 121, thereby preventing a decrease in luminance and brightness, due to light absorbed by the first electrode 121.

The light-emitting structure 110 includes the central region S1 in which the first electrode 121 is located and the peripheral region S2 that surrounds the central region S1.

When viewed from the bottom, the central region S1 is disposed at a middle of the light-emitting structure 110 and is located inside the peripheral region S2. The peripheral region S2 defines a closed space for accommodating the central region S1 therein.

The central region S1 and the peripheral region S2 may have step differences. In detail, the central region S1 has a step that protrudes downward from the peripheral region S2. An area where the first electrode 121 is located is smaller than a lower area of the light-emitting structure 110, and the first electrode 121 is located inward from a lower edge of the light-emitting structure 110. This prevents a plurality of light-emitting devices 100 from being aligned in one pixel region P. In other words, even when side (or lateral) surfaces of the plurality of light-emitting devices 100 are in contact with each other on a plane, a diameter d2 of the central region S1 in which the first electrode 121 is located is less than a width d3 of the light-emitting structure 110, and the metal bonding layer 13 is formed to correspond to the first electrode 121, thereby lowering a possibility of the plurality of light-emitting devices 100 coupled to one metal bonding layer 13.

The step between the central region S1 and the peripheral region S2 may be formed by disposing a semiconductor layer beneath the light-emitting structure 110, or by etching the peripheral region S2 of the light-emitting structure 110 upward.

The step between a lower surface of the central region S1 and a lower surface of the peripheral region S2 is not limited. The step between the lower surface of the central region S1 and the lower surface of the peripheral region S2 may be, preferably, 500 nm to 7000 nm. This is because if the step between the lower surface of the central region S1 and the lower surface of the peripheral region S2 is less than 500 nm, the central region S1 is easily separated or displaced even when inserted into the positioning partition wall 12, whereas the step therebetween is greater than 7000 nm, efficiency of the light-emitting device 100 is reduced. Here, the first electrode 121 is disposed at the lower surface of the central region S1.

In more detail, at least a side (or lateral) surface of the first conductive semiconductor layer 111 is exposed to a boundary between the central region S1 and the peripheral region S2. More preferably, at least the side surface of the first conductive semiconductor layer 111, a side surface of the active layer 112 and a part (or portion) of a side surface of the second conductive semiconductor layer 113 are exposed to the boundary between the central region S1 and the peripheral region S2. The central region S1 may be formed by etching the lower edge of the light-emitting structure 110.

A planar width or diameter of the light-emitting structure 110 is greater than a planar width or diameter of the central region S1. The planar width or diameter of the central region S1 may be, preferably, 50% to 85% of those of the light-emitting structure 110. The width of the peripheral region S2 is equally formed along a circumference of the central region S1.

When viewed from the bottom, the light-emitting structure 110 has a shape of any one of a rectangular shape, a polygonal shape, and a circular shape. When the light-emitting structure 110 is densely disposed on a plane, a shape with a high porosity is more suitable. Therefore, a planar shape of the light-emitting structure 110 may be a hexagonal or more polygonal shape, or a circular shape.

When viewed from the bottom, the central region S1 may have a shape of any one of a rectangular shape, a polygonal shape, and a circular shape. The central region S1 may have a planar shape that corresponds to the planar shape of the light-emitting structure 110, or have a different planar shape. However, in order to prevent the plurality of light-emitting devices 100 from being arranged in one pixel region P, the planar shape of the central region S1 may be, preferably, the same as the planar shape of the light-emitting structure 110. Accordingly, it is preferable that the central region S1 disposed at the center of the lower surface of the light-emitting structure 110 has a hexagonal or more polygonal shape, or a circular shape.

A shape of the peripheral region S2 viewed from below is determined by the shapes of the central region S1 and the light-emitting structure 110. The peripheral region S2 has a ring shape when viewed from the bottom. The peripheral region S2 serves as a buffer for preventing an electrode of the light-emitting device 100 located around the pixel region P from being brought into contact with the metal bonding layer 13 or the lower wiring 11 of the pixel region P.

In addition, the light-emitting device 100 further includes an insulating layer 124. The insulating layer 124 prevents the lower wiring 11 from being electrically connected to other layers, except the first conductive semiconductor layer 111. In detail, the insulating layer 124 covers a side surface of the light-emitting structure 110. More specifically, the insulating layer 124 is disposed to surround the circumference of the central region S1 and the peripheral region S2, and is disposed at a lower portion of the peripheral region S2. The insulating layer 124 includes a resin material made of an electrically insulating material.

Figure 7A:
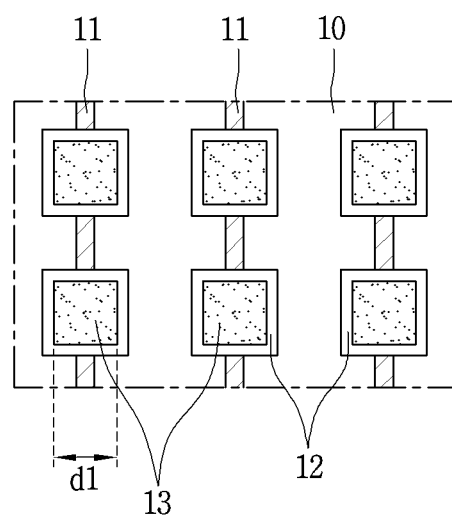
FIGS. 7A and 7B are views illustrating modified examples of positioning partition walls according to the first embodiment of the present disclosure.
Figure 7B:
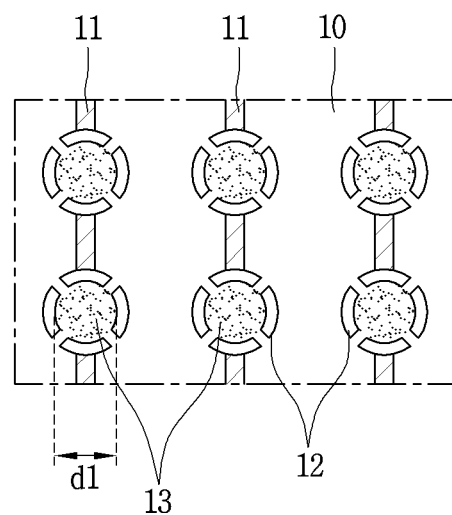

FIGS. 7A and 7B are views illustrating modified examples of the positioning partition walls according to the first embodiment of the present disclosure.

Referring to FIG. 7A, the positioning partition wall 12 in FIG. 7A has a different shape to the positioning partition wall 12 of the first embodiment. The positioning partition wall 12 according to the modified example of FIG. 7A has a polygonal shape on a plane. In detail, the planar shape of the positioning partition wall 12 is rectangular. Here, the central region S1 is also formed in a rectangular planar shape.

Referring to FIG. 7B, the positioning partition wall 12 in FIG. 7B has a different shape to the positioning partition wall 12 of the first embodiment. The positioning partition wall 12 according to the modified example of FIG. 7B is disposed on a boundary line surrounding the central region S1 in a non-continuous (or discontinuous) manner, when viewed from above.

Figure 8A:
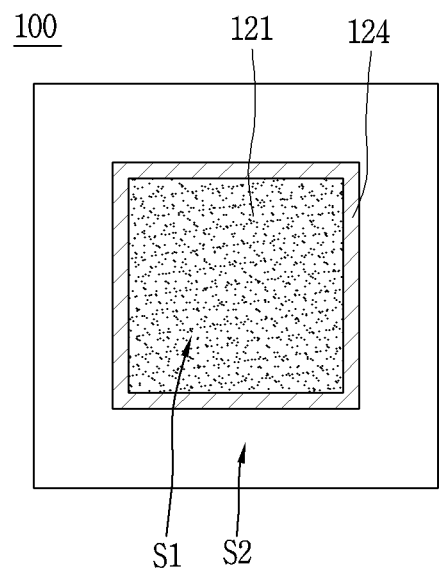
FIGS. 8A and 8B are views illustrating modified examples of the light-emitting device according to the first embodiment of the present disclosure.
Figure 8B:
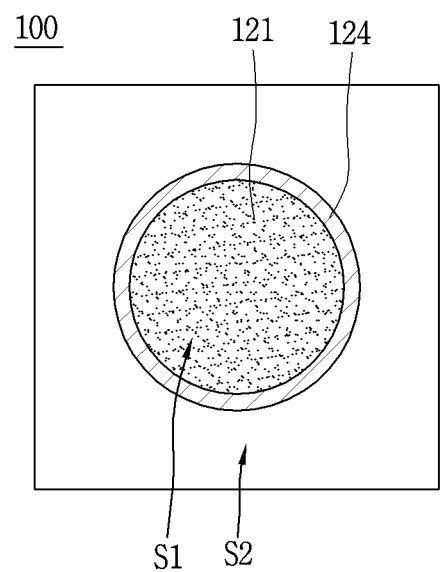

FIGS. 8A and 8B are views illustrating modified examples of the light-emitting device according to the first embodiment of the present disclosure.

Referring to FIG. 8A, the light-emitting device 100 in FIG. 8A has a different shape to the light-emitting device 100 of the first embodiment. The light-emitting structure 110 according to the modified example of FIG. 8A has a polygonal shape on a plane. More specifically, the planar shape of the light-emitting structure 110 is rectangular.

In addition, the central region S1 has the rectangular planar shape that corresponds to the planar shape of the light-emitting structure 110.

Referring to FIG. 8B, the light-emitting device 100 in FIG. 8B has a different shape to the light-emitting device 100 according to the first embodiment. In the modified example of FIG. 8B, the light-emitting structure 110 has a rectangular shape on a plane, and the central region S1 has a circular shape on a plane.

FIGS. 9A to 9D are views illustrating a method of fabricating the display device according to the first embodiment of the present disclosure.

Figure 9A:
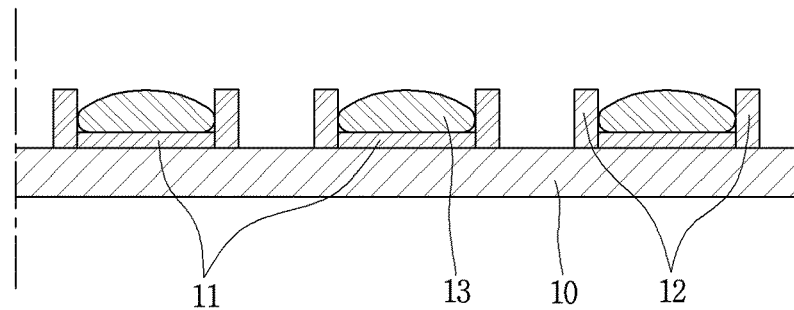
FIGS. 9A to 9D are views illustrating a method of fabricating the display device according to the first embodiment of the present disclosure.

Referring to FIG. 9A, the lower substrate 10 having the lower wiring 11 disposed thereon is prepared. The positioning partition wall 12 is formed on the lower substrate 10. The metal bonding layer 13 is located inside a space defined by the positioning partition wall 12.

Figure 9B:
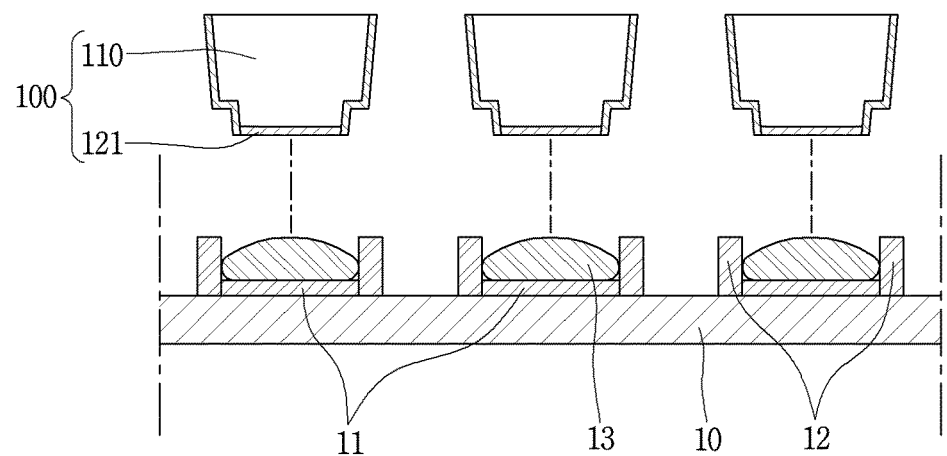
Figure 9C:
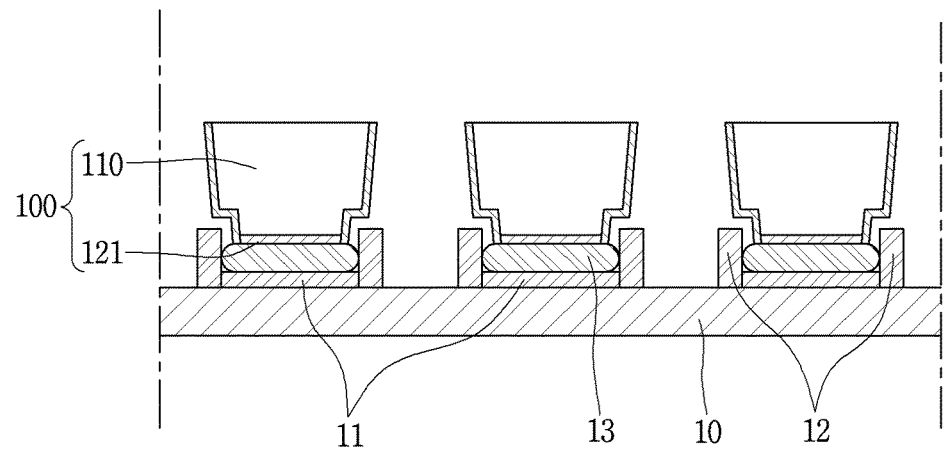

Referring to FIGS. 9B and 9C, numerous light-emitting devices 100 are aligned with respective pixel regions P by a capillary force acting between the metal bonding layer 13 and the first electrode 121 of the light-emitting device 100. In detail, the lower substrate 10 provided with the metal bonding layer 13 is put into a container containing a solution with the numerous light-emitting devices 100, and vibration is applied. In the solution, the light-emitting devices 100 are aligned with the respective pixel regions P by the capillary force between the metal bonding layer 13 and the first electrode 121 of the light-emitting device 100. At this time, heat is applied to melt the metal bonding layer 13. The melted metal boding layer 10 allows the first electrode 121 to be adhered onto the lower wiring 11.

Here, the light-emitting device 100 is put into the solution in a state that the first electrode 121 and the light-emitting structure 110 are only formed. This is because when the second electrode 122 is formed, a defect occurs, namely, the second electrode 122 and the lower wiring 11 are connected to each other.

Shapes of the positioning partition wall 12 and the central region S1 may prevent two or more of the light-emitting devices 100 from being aligned in one pixel region P. The central region S1 of the light-emitting structure 110 may be easily inserted into the positioning partition wall 12 even when the central region S1 has a circular shape to allow the light-emitting structure 110 to be rotated.

Figure 9D:
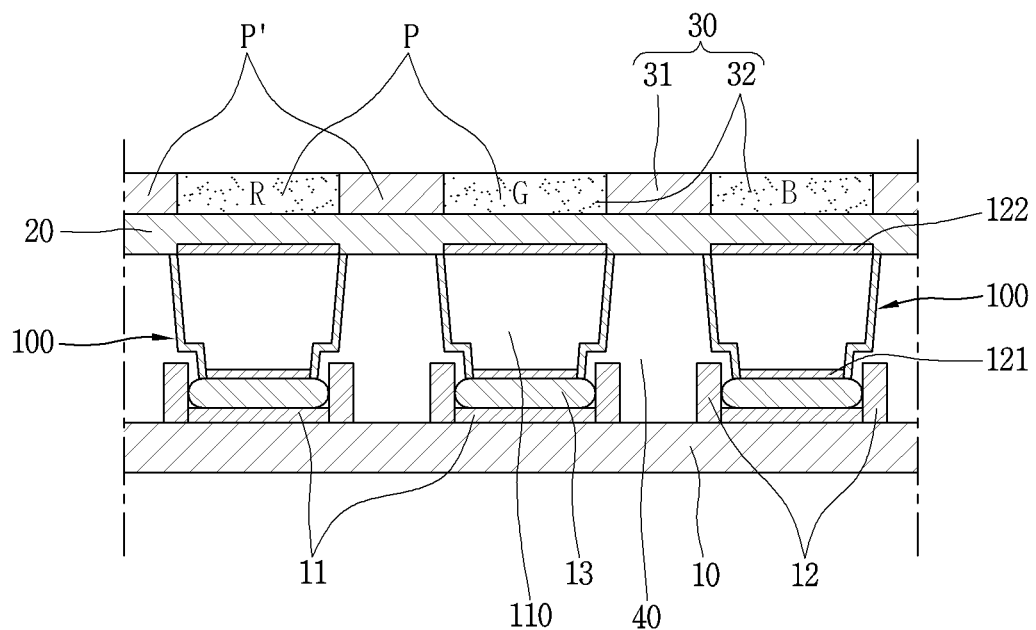

Referring to FIG. 9D, the second electrode 122 is formed on the light-emitting device 100. A molding material is filled in an air gap (or void) between the light-emitting devices 100 to be flattened. Then, the upper wiring 20 and the color substrate 30 are disposed on the light-emitting device 100.

Figure 10:
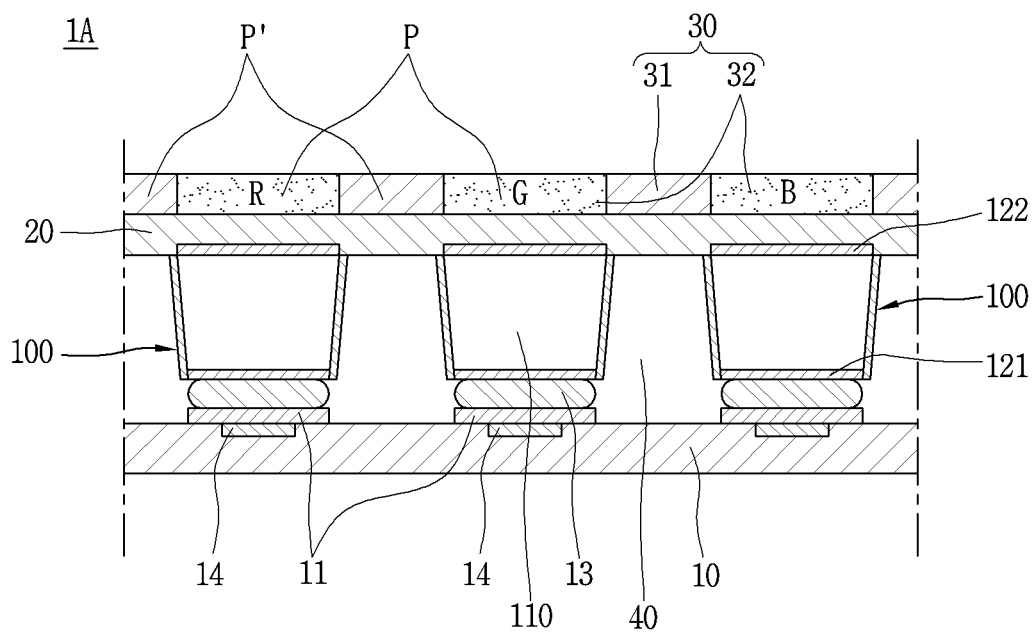
FIG. 10 is a cross-sectional view of a display device according to a second embodiment of the present disclosure.
Figure 11:
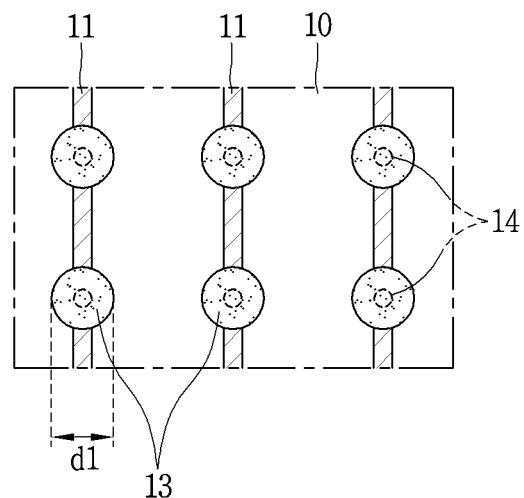
FIG. 11 is a planar view of a lower substrate according to the second embodiment of the present disclosure.
Figure 12:
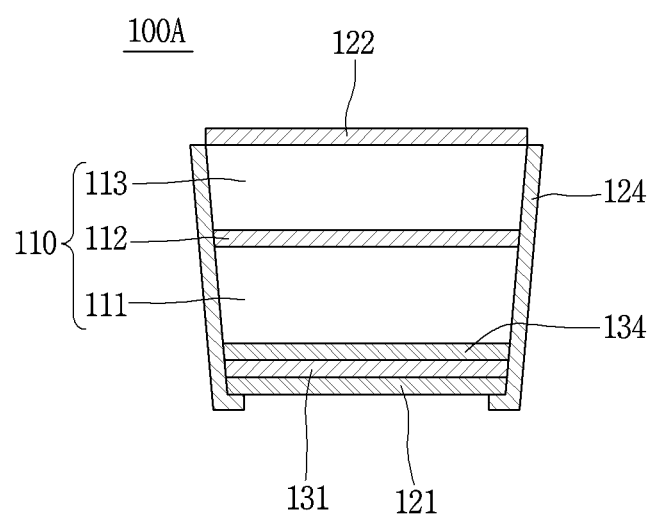
FIG. 12 is a cross-sectional view of a light-emitting device according to the second embodiment of the present disclosure.

FIG. 10 is a cross-sectional view of a display device according to a second embodiment of the present disclosure, FIG. 11 is a planar view of a lower substrate according to the second embodiment of the present disclosure, and FIG. 12 is a cross-sectional view of a light-emitting device according to the second embodiment of the present disclosure.

Referring to FIGS. 10 to 12, a display device 1A according to the second embodiment further includes a magnetic portion (or part) located at any one of the lower substrate 10 and a light-emitting device 100A, and a reaction portion (or part) located at the remaining one, as compared to the first embodiment. Hereinafter, the difference from the first embodiment will be mainly discussed, and a description the same as the first embodiment will be omitted.

The display device 1A according to the second embodiment includes the lower substrate 10 on which at least two lower wirings 11 are disposed, at least two light-emitting devices 100A each having the first electrode 121 electrically connected to the lower wiring 11 and the light-emitting structure 110 that generates light, and the magnetic portion located on any one of the light-emitting device 100A and the lower substrate 10, and the reaction portion located on the remaining one, so as to be attracted by the magnetic portion.

In the second embodiment, the positioning partition wall 12 of the first embodiment is not provided. In the second embodiment, one light-emitting device 100A is self-aligned in one pixel region P by a magnetic force acting between the magnetic portion and the reaction portion.

The metal bonding layer 13 is disposed on the lower wiring 11 in an area where the light-emitting device 100A is to be located, as in the first embodiment.

The light-emitting device 100A of the second embodiment has no distinction between the central region S1 and the peripheral region S2 at a lower portion the light-emitting device 100A, as compared with the light-emitting device 100 of the first embodiment. That is, the lower portion of the light-emitting device 100A is formed flat.

In particular, referring to FIG. 12, the light-emitting device 100A of the second embodiment includes the light-emitting structure 110, the first electrode 121, and the second electrode 122. The display device 1A of the second embodiment further includes the upper wiring 20 electrically connected to the second electrode 122 and the color substrate 30 disposed on the light-emitting device 100A.

The light-emitting structure 110 includes the first conductive semiconductor layer 111, the active layer 112 located on the first conductive semiconductor layer 111, and the second conductive semiconductor layer 113 located on the active layer 112.

The first electrode 121 is exposed to a lower portion of the first conductive semiconductor layer 111, and the second electrode 122 is exposed to an upper portion of the second conductive semiconductor layer 113.

The insulating layer 124 is also provided in the second embodiment. The insulating layer 124 is disposed to surround at least a side surface of the light-emitting structure 110.

The plurality of light-emitting devices 100A is aligned on the lower wiring 11 of the lower substrate 10 by an attractive force between the magnetic portion and the reaction portion.

The magnetic portion is a material having a magnetic force. For example, the magnetic portion includes a magnet. The magnetic portion includes a permanent magnet or a temporary magnet. The magnetic portion is located at any one of the lower substrate 10 and the light-emitting device 100A. However, in case the magnetic portion is implemented as a magnet, the magnetic portion should be located on the lower substrate 10 since it is difficult to place the magnet on the light-emitting device 100A.

Alignment positions of the light-emitting devices 100A on the lower substrate 10 are defined by these magnetic portions. The magnetic portions are arranged on the lower substrate 10 corresponding to the respective pixel regions P. More specifically, the magnetic portions are arranged to vertically overlap a part of the lower wirings 11 vertically overlapping the respective pixel regions P.

The magnetic portion may be located beneath the lower wiring 11. That is, each of the magnetic portions may be located between the lower wiring 11 and the lower substrate 10. In addition, the magnetic portions may be located inside the lower substrate 10, or located at a lower surface of the lower substrate 10. For example, as illustrated in FIG. 10, the magnetic portion may include a first magnetic portion 14 buried or embedded in the lower substrate 10.

When an area of the magnetic portion is too large, a plurality of light-emitting devices 100A may be arranged in one pixel region P. Thus, each of the magnetic portions has a planar shape that corresponds to the first electrode 121. In detail, the magnetic portions have a circular planar shape as illustrated in FIG. 11. In addition, the area and width of the magnetic portions are less than those of the first electrode 121.

Here, the metal bonding layer 13 is disposed to vertically overlap the magnetic portion. The magnetic portion vertically overlaps a middle portion of the metal bonding layer 13, but does not overlap edges of the metal bonding layer 13.

The reaction portion reacts with a magnetic force of the magnetic portion, so that an attractive force is generated therebetween.

For example, the reaction portion includes a magnet so that an attractive force is acted on the magnetic portion. More specifically, the magnetic portion is a magnet having a first polarity, and the reaction portion is a magnet having a second polarity opposite to the first polarity.

As another example, the reaction portion includes a magnetic metal so that an attractive force is acted on the magnetic portion. The magnetic metal is a metal that includes a magnetic body that is attracted by a magnetic force of the magnet. The magnetic metal includes a ferromagnetic material. In detail, the reaction portion includes any one element of Ni, Cr, Mo, and Fe, or is an alloy of these elements.

The reaction portion is located at the remaining one of the lower substrate 10 and the light-emitting device 100A. As the reaction portion is made of a magnetic metal, the reaction portion may be, preferably, located at the light-emitting device 100A.

As the reaction portion is a conductor, it is configured to be electrically connected to the first electrode 121 and/or the second electrode 122 during a growth process of the light-emitting device 100A so as to prevent an electrical short circuit. More specifically, the reaction portion may be formed by a deposition method such as sputtering together with the first electrode 121 and/or the second electrode 122.

In particular, referring to FIG. 12, the reaction portion is implemented as a first magnetic electrode 131 located between the first electrode 121 and the first conductive semiconductor layer 111. Accordingly, the first magnetic electrode 131 is located beneath or below the first conductive semiconductor layer 111, and the first electrode 121 is located beneath the first magnetic electrode 131.

A bonding layer 134 may be provided between the first magnetic electrode 131 and the first conductive semiconductor layer 111 to improve a binding (or coupling) force between the first magnetic electrode 131 and the first conductive semiconductor layer 111. The bonding layer 134 is at least one element of Sn, Ag, Cu, Pb, Al, Bi, Cd, Fe, In, Ni, Sb, Zn, Co, and Au, or a compound of these elements. Further, the bonding layer 134 and the first magnetic electrode 131 may be implemented as a single layer.

The first magnetic electrode 131 is an electrically conductive material, and includes a magnetic metal attracted by a magnetic force of the magnetic portion. The first magnetic electrode 131 includes any one element of Ni, Cr, Mo, and Fe, or an alloy of these elements.

Figure 13:
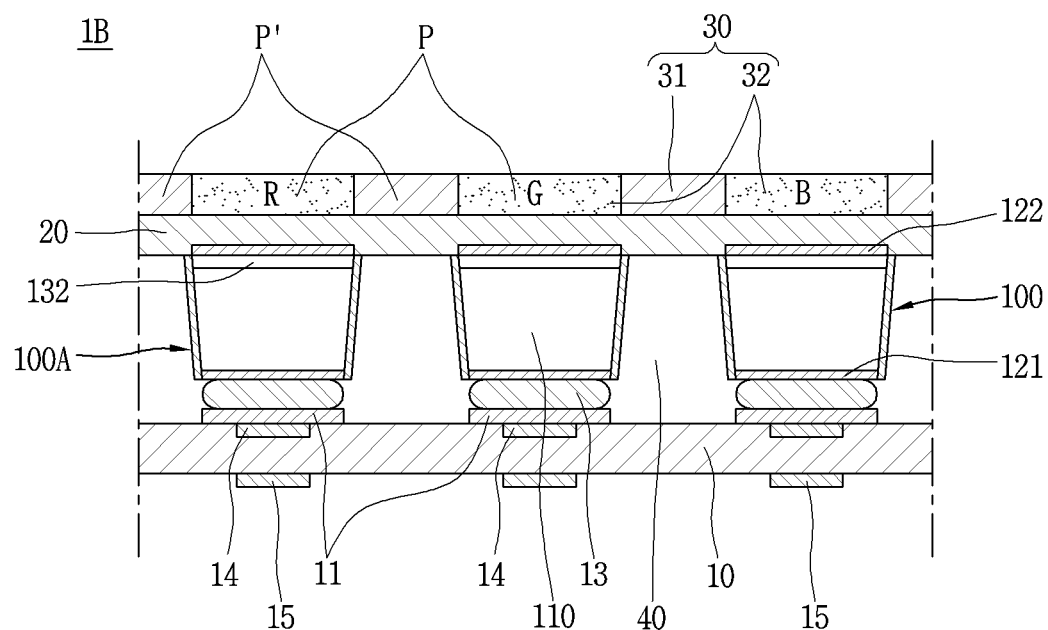
FIG. 13 is a cross-sectional view of a display device according to a third embodiment of the present disclosure.

FIG. 13 is a cross-sectional view of a display device according to a third embodiment of the present disclosure.

Referring to FIG. 13, a display device 1B according to the third embodiment further includes a second magnetic portion 15 and a second magnetic electrode 132, as compared to the second embodiment.

The magnetic portion may include the first magnetic portion 14 and the second magnetic portion 15, or include only the second magnetic portion 15 or only the first magnetic portion 14. In FIG. 13, the magnetic portion includes the first magnetic portion 14 and the second magnetic portion 15.

When a magnetic force of the magnetic portion is weak, a possibility of proper alignment of the light-emitting device 100A decreases, and thus a plurality of magnetic portions may be provided. That is, a plurality of magnetic portions is provided in one pixel region P.

The second magnetic portion 15 is located at the lower surface of the lower substrate 10. In detail, the second magnetic portion 15 is disposed to vertically overlap the first magnetic portion 14, and has a shape and a size corresponding to a shape and a size of the first magnetic portion 14.

The reaction portion may include the first magnetic electrode 131 and the second magnetic electrode 132, or include only the first magnetic electrode 131. In FIG. 13, the reaction portion includes the first magnetic electrode 131 and the second magnetic electrode 132.

The second magnetic electrode 132 is electrically connected to the second electrode 122. The second magnetic electrode 132 is located between the second electrode 122 and the second conductive semiconductor layer 113. The second magnetic electrode 132 is used to provide more magnetic force when the magnetic force is insufficient with the first magnetic electrode 131 alone.

Figure 14A:
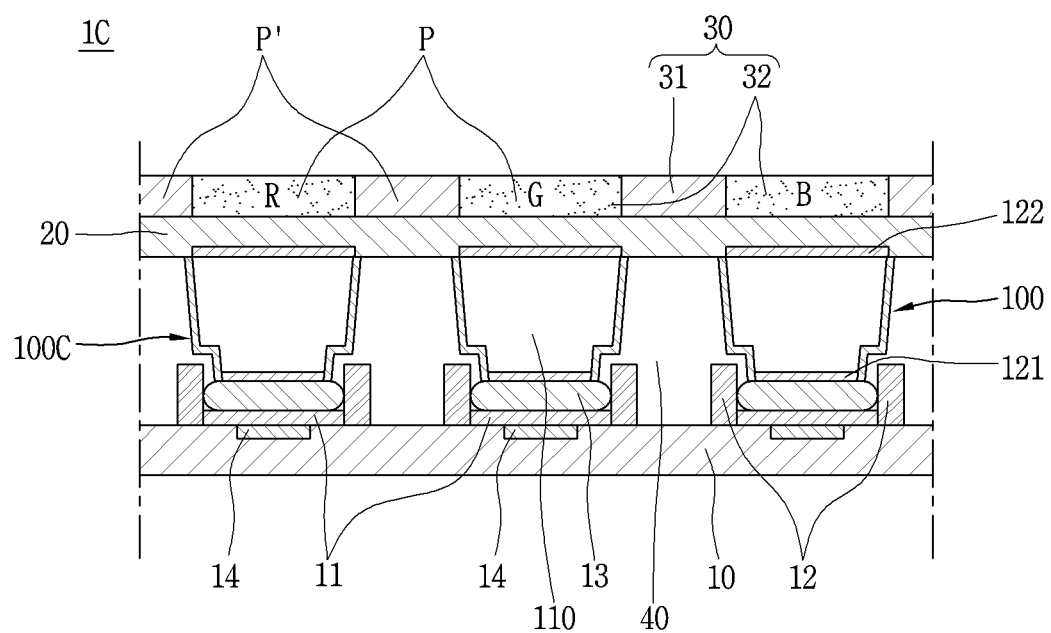
FIG. 14A is a cross-sectional view of a display device according to a fourth embodiment of the present disclosure.
Figure 14B:
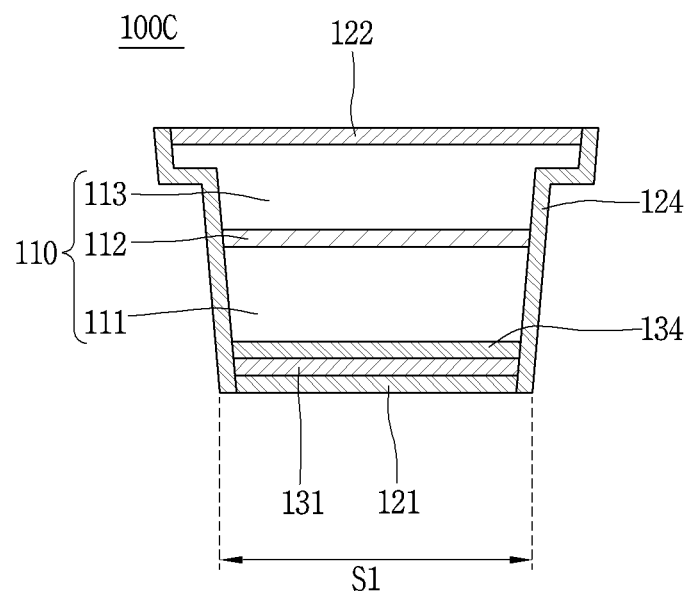
FIG. 14B is a cross-sectional view of a light-emitting device according to the fourth embodiment of the present disclosure.

FIG. 14A is a cross-sectional view of a display device according to a fourth embodiment of the present disclosure, and FIG. 14B is a cross-sectional view of a light-emitting device according to the fourth embodiment of the present disclosure.

A display device 1C according to the fourth embodiment has a different shape to the display device 1A of the second embodiment.

In a light-emitting device 100C of the fourth embodiment, the light-emitting structure 110 is divided into a central region S1 and a peripheral region S2, and the first electrode 121 and the first magnetic electrode 131 are located at the central region S1. The central region S1 and the peripheral region S2 are the same as those described in the first embodiment.

Accordingly, a possibility of a plurality of light-emitting devices 100C located in one pixel region P is reduced.

Figure 15A:
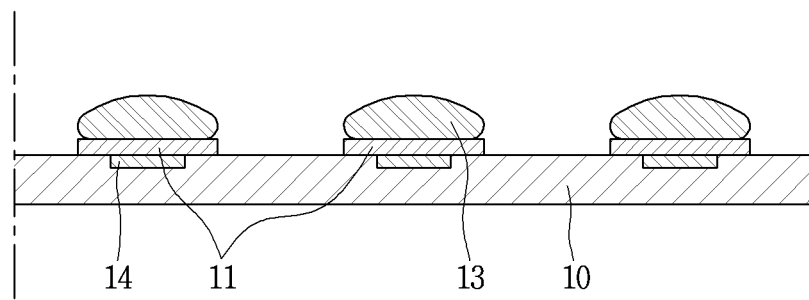
FIGS. 15A to 15C are views illustrating a method of fabricating the display device according to the second embodiment of the present disclosure.
Figure 15B:
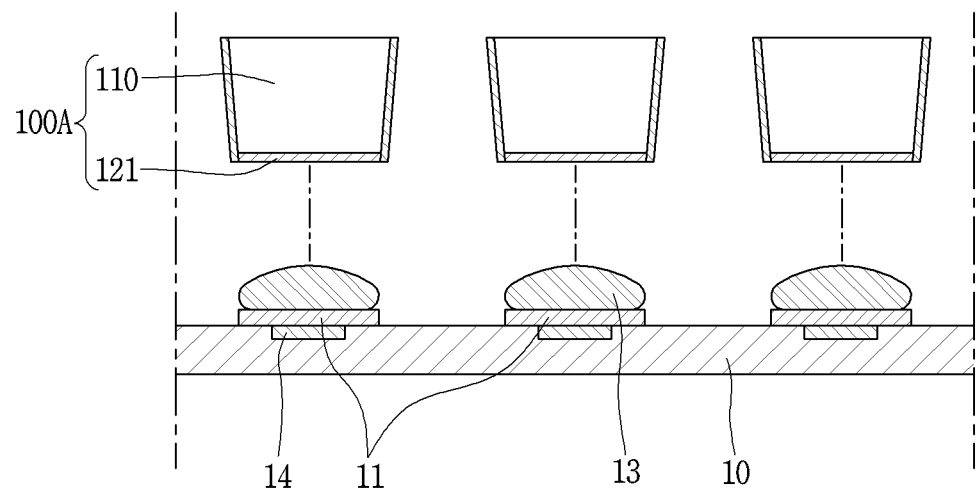
Figure 15C:
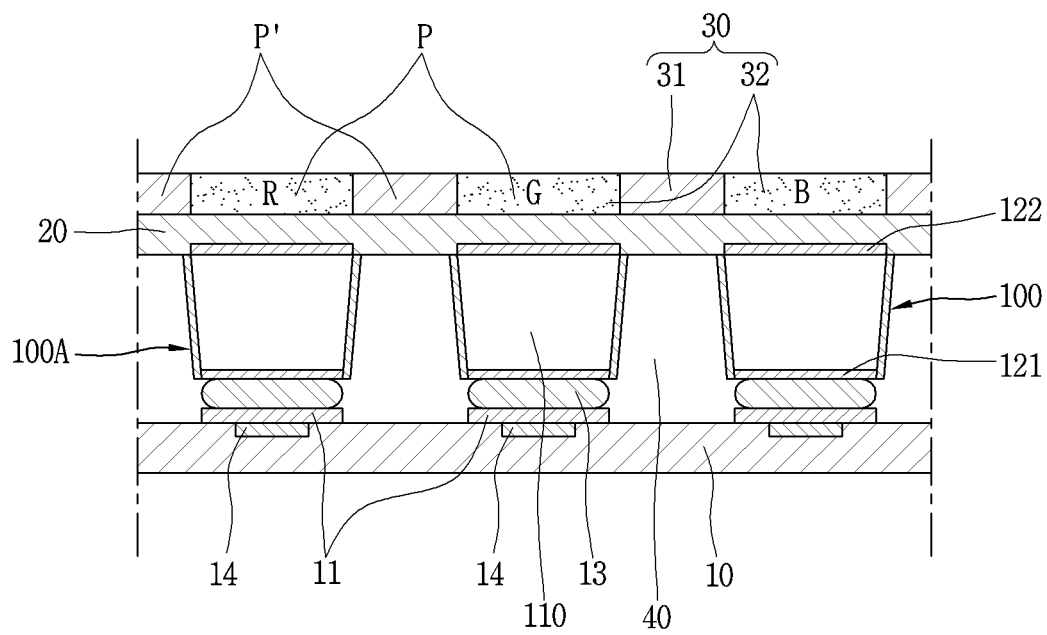

FIG. 15A to 15C are views illustrating a method of fabricating the display device according to the second embodiment of the present disclosure.

Referring to 15A, first, the lower substrate 10 having the lower wiring 11 disposed thereon is prepared. The first magnetic portion 14 is formed on the lower substrate 10. The metal bonding layer 13 is disposed on the lower wiring 11 corresponding to the pixel region P.

Referring to FIGS. 15B and 15C, numerous light-emitting devices 100A are aligned with respective pixel regions P by a capillary force between the metal bonding layer 13 and the first electrode 121 of the light-emitting device 100A, and an attractive force between the first magnetic portion 14 and the first magnetic electrode 131 of the light-emitting device 100A. More specifically, the lower substrate 10 is put into a container including a solution containing the numerous light-emitting devices 100A, and vibration is applied thereto. Then, the light-emitting devices 100A are aligned to the respective pixel regions P in the solution by the magnetic force and the capillary force. Here, heat is applied to melt the metal bonding layer 13. The melted boding layer 13 allows the first electrode 121 to be adhered onto the lower wiring 11.

At this time, the light-emitting device 100A is put into the solution in a state that the first electrode 121, the first magnetic electrode 131, and the light-emitting structure 110 are only formed. This is because when the second electrode 122 is formed, a defect occurs, namely, the second electrode 122 and the lower wiring 11 are connected to each other.

Then, the second electrode 122 is formed on the light-emitting device 100A. A molding material is filled in an air gap between the light-emitting devices 100A to be flattened. Thereafter, the upper wiring 20 and the color substrate 30 are disposed on the light-emitting device 100A.

Meanwhile, the present disclosure provides a structure for improving accuracy of transferring light-emitting devices by using the fabrication method according to FIGS. 9A to 9D. Hereinafter, for the sake of convenience, a description will be given that the magnetic portion is disposed on the lower substrate and the reaction portion is disposed on the light-emitting device.

Figure 16:
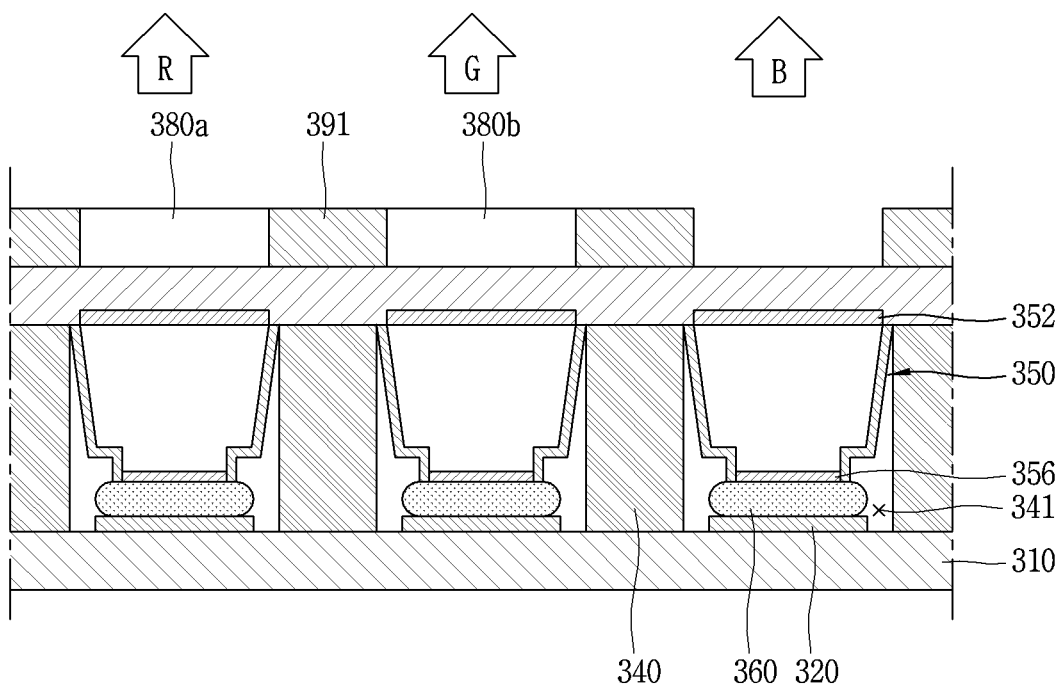
FIG. 16 is a cross-sectional view of a display device according to the present disclosure.
Figure 17:
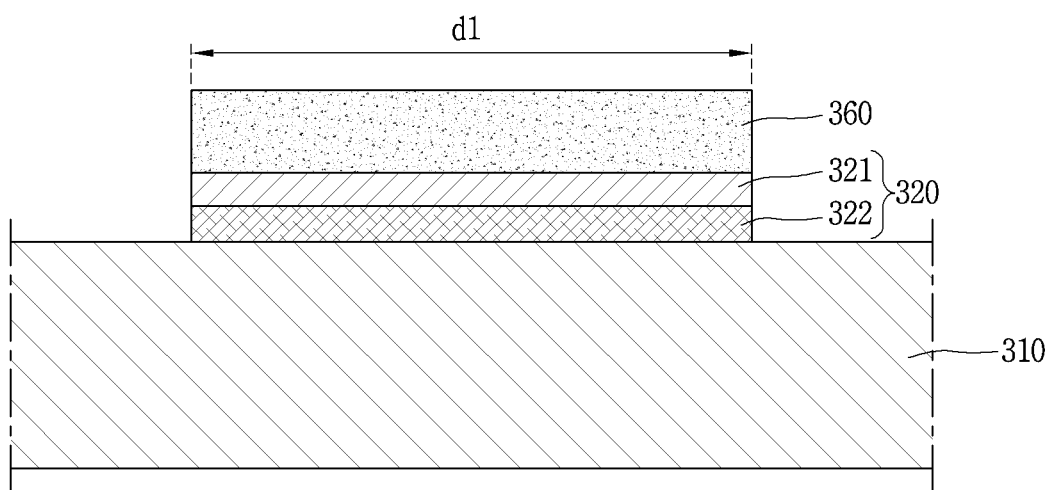
FIG. 17 is a cross-sectional view of a lower wiring according to the present disclosure.
Figure 18:
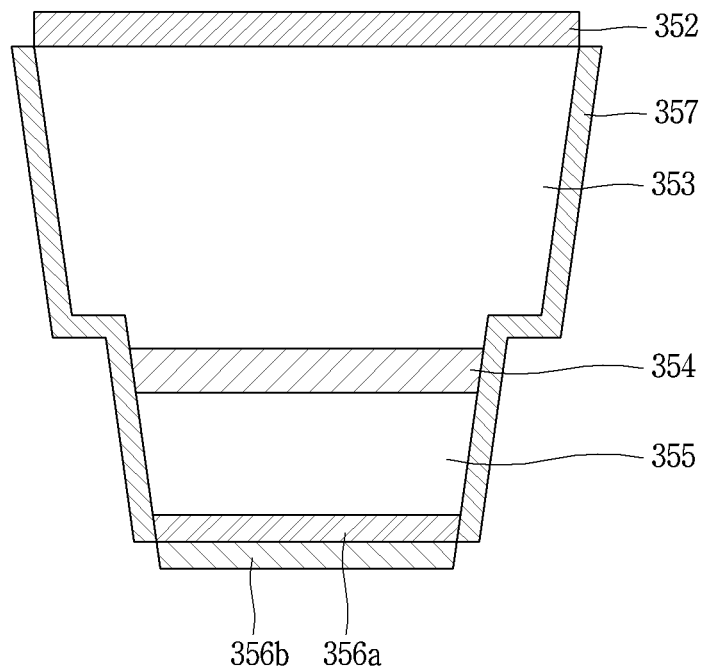
FIG. 18 is a cross-sectional view of a light-emitting device according to the present disclosure.
Figure 19:
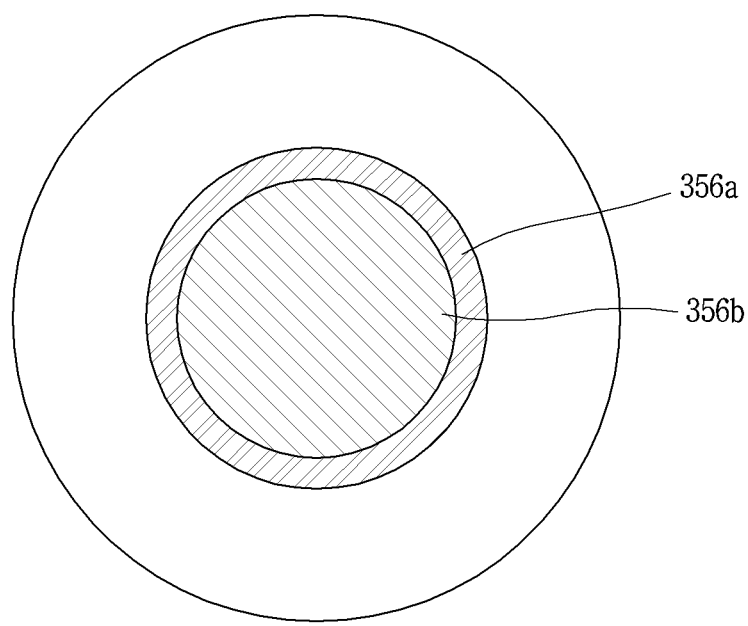
FIG. 19 is a bottom view of the light-emitting device according to the present disclosure.

FIG. 16 is a cross-sectional view of a display device according to the present disclosure, FIG. 17 is a cross-sectional view of a lower wiring, FIG. 18 is a cross-sectional view of a light-emitting device according to the present disclosure, and FIG. 19 is a bottom view of the light-emitting device according to the present disclosure.

A display device according to the present disclosure may include a lower substrate 310, a lower electrode 320, a flat layer 340, a light-emitting device 350, a second electrode 352, a first electrode 356, a black matrix 391, a red color filter 380a, a green color filter 380b, a magnetic portion 321, and a reaction portion 356a. Hereinafter, these components will be described in detail.

A description of the lower substrate 310 will be replaced by the description of the lower substrate in FIG. 3, and a description of the lower electrode 320 will be replaced by the aforementioned description of the lower wiring.

The magnetic portion 321 is formed on the lower substrate 310 and generates a magnetic field, thereby forming an attractive force or repulsive force with a magnetic material. The magnetic portion 321 may be made of a thin film magnet. The thin film magnet may be made of a ferromagnetic material. For example, the thin film magnet may be made of an Sm—Co alloy. An area of the thin film magnet may correspond to 10 to 200% of an area of the semiconductor light-emitting device 350.

Here, when the thin film magnet is made of a ferromagnetic material, the thin film magnet may be magnetized in a constant direction. The magnetization direction of the thin film magnet may be a direction perpendicular to the lower substrate 310. This may allow the light-emitting device 350 to be aligned to a correct or proper position when transferring the light-emitting device 350 onto the lower substrate 310. Since the magnetization direction greatly affects transfer accuracy, the thin film magnet should be made of the ferromagnetic material that is not affected by an external magnetic field. The Sm—Co alloy may be magnetized in a direction perpendicular to the lower substrate 310, making it suitable to be used in the thin film magnet.

In one embodiment, based on the total weight of the thin film magnet, the thin film magnet may be made of an Sm—Co alloy composed of 34% of Sm and 66% of Co by weight, or an Sm—Co alloy composed of 23% of Sm and 77% of Co by weight. Here, an error range of the alloy composition is within 10%.

Meanwhile, a thickness of the thin film magnet may be 20 to 1000 nm. When the thickness of the thin film magnet is less than 20 nm, intensity of the magnetic field generated in the thin film magnet is insufficient to align the light-emitting device. In contrast, when the thickness of the thin film magnet exceeds 1000 nm, the resistivity (or specific resistance) of the circuit may be excessively increased due to the thin film magnet.

As illustrated in FIG. 17, the lower electrode 320 may include a plurality of layers, and the magnetic portion 321 and the reaction portion 322 may be any one of the plurality of layers constituting the lower electrode 320.

Meanwhile, the reaction portion 356a that forms an attractive force with the magnetic portion 321 may be disposed at the light-emitting device 350. As illustrated in FIG. 18, the reaction portion 356a may be disposed between a first conductive electrode 356b and a first conductive semiconductor layer 355.

The reaction portion 356a may be made of a magnetic material. More specifically, the reaction portion 356a may be, preferably, a paramagnetic material. For transferring the light-emitting devices 350 onto the lower substrate 310, a dispersion liquid of light-emitting device is applied onto the lower substrate 310. Here, when the light-emitting device 350 is made of a ferromagnetic material, the light-emitting devices 350 may aggregate with each other. The reaction portion 356a may, preferably, react with a magnetic field generated in the magnetic portion 321.

The reaction portion 356a may be made of a ferromagnetic material and a paramagnetic material. For example, the reaction portion 356a may be made of any one of Ni, Fe, Mo, and Co, or an Ni—Mo—Fe alloy or an Ni—Cr—Mo—Fe alloy. The Ni—Mo—Fe alloy and the Ni—Cr—Mo—Fe alloy have strong corrosion resistance to acid, thereby preventing the reaction portion 356a from being corroded by the acid used in a transfer process of the light-emitting devices 350.

Meanwhile, a thickness of the reaction portion 356a may be 0.01 nm to 5 μm. When the thickness of the reaction portion 356a is less than 0.01 nm, an attractive force between the reaction portion 356a and the magnetic portion 321 may not be sufficient. In contrast, when the thickness of the reaction portion 356a exceeds 5 μm, the resistivity of the circuit may be excessively increased due to the reaction portion 356a.

Meanwhile, each of the light-emitting devices 350 may include a first electrode electrically connected to the lower electrode 320 and having a plurality of layers, a first conductive semiconductor layer located on the first electrode, an active layer located on the first conductive semiconductor layer, and a second conductive semiconductor layer located on the active layer. The reaction portion 356a may be any one of the plurality of layers constituting the first electrode.

In detail, the first electrode may include a first metal layer in contact with the first conductive semiconductor layer and a second metal layer in contact with the lower electrode 320. The reaction portion 356a may be disposed between the first metal layer and the second metal layer. As the reaction portion 356a made of a paramagnetic material increases the resistivity of the circuit, the first and second metal layers should have a lower resistivity than the reaction portion 356a.

Alternatively, the reaction portion 356a may be made of a magnetically conductive material, so that the reaction portion 356a and the first conductive electrode 356b are formed as an integrated electrode, instead of being implemented as a separate layer formed on the first conductive electrode 356b.

As illustrated in FIG. 18, areas of the reaction portion 356a and the first conductivity electrode 356b may be less (or smaller) than an area of the first conductivity semiconductor layer 355. This is to improve transfer accuracy of the semiconductor light-emitting devices 350 that includes the second electrode layer 352, the insulating layer 357, the second conductive semiconductor layer 353 and the active layer 354.

Meanwhile, the display device according to the present disclosure includes the flat layer 340 covering the wiring substrate 310 and having a plurality of holes 341. The flat layer 340 may be made of a light transmissive material.

Each of the holes 341 formed in the flat layer 340 may be provided at a position corresponding to a region where the lower electrode 320 is formed. The hole 341 allows the lower electrode 320 to be exposed to the outside before the light-emitting device 350 is being transferred.

When the light-emitting device 350 is transferred while only a portion of the lower electrode 320 is exposed to the outside, the light-emitting device 350 is selectively transferred onto the lower electrode 320 that is exposed to the outside. As described above, the hole 341 serves to allow the light-emitting device 350 to be coupled to a specific position in the transfer process.

The hole 341 may be formed in various shapes. A shape of the light-emitting device 350 transferred on the lower electrode 320 may be changed (or determined) according to the shape of the hole 341. In detail, when the hole 341 has a circular shape, a circular-shaped light-emitting device may be transferred onto the lower electrode 320. Or, when the hole 341 has a rectangular shape, a rectangular-shaped light-emitting device may be transferred onto the lower electrode 320.

Meanwhile, the display device according to the present disclosure may further include a metal bonding layer 360 that joins the light-emitting device 350 and the lower electrode 320 together. The metal bonding layer 360 is the same as described above.

When the display device is configured as described above, a time taken to transfer the light-emitting devices will be reduced. Hereinafter, a method of fabricating the display device according to the present disclosure will be described.

Figure 20A:
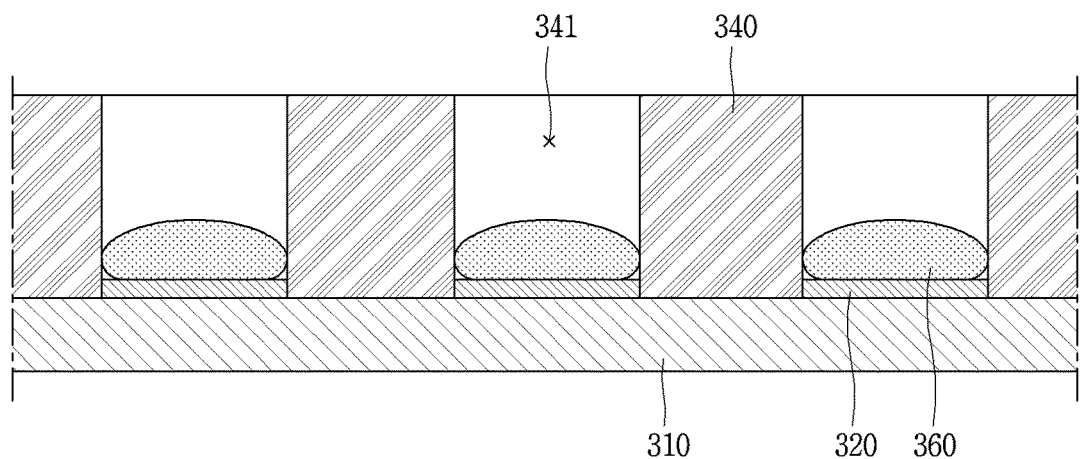
FIGS. 20A to 20C are cross-sectional views illustrating a method of fabricating the display device according to the present disclosure.
Figure 20B:
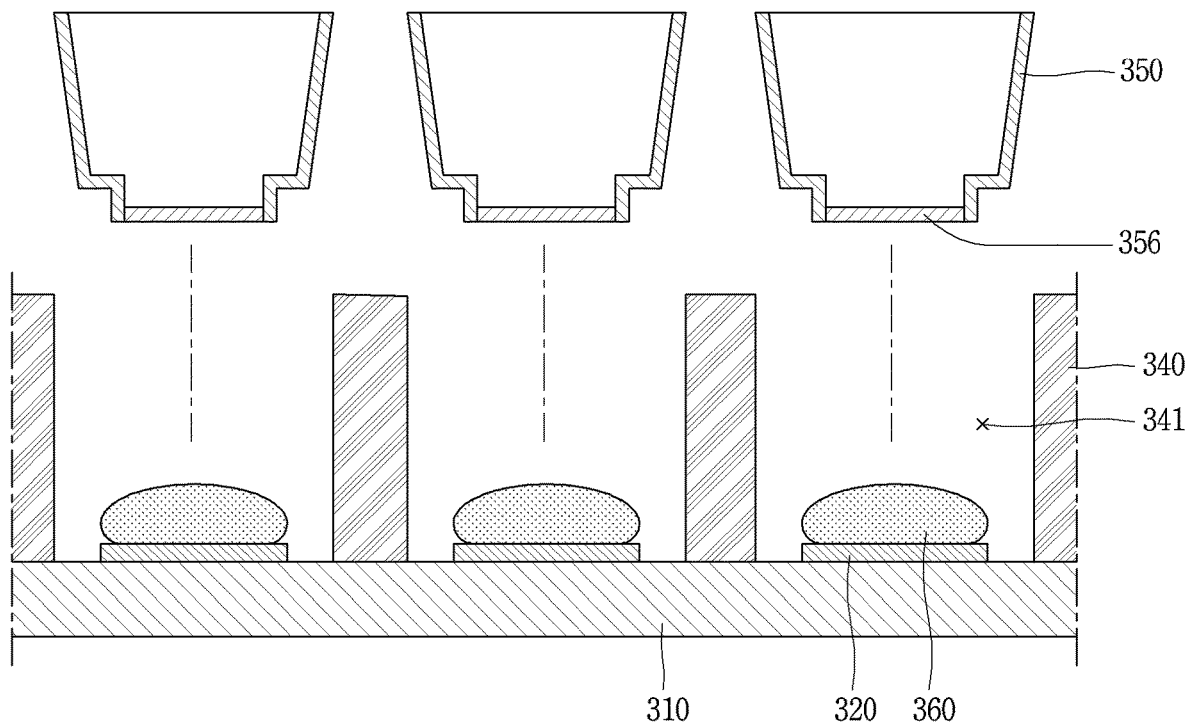
Figure 20C:
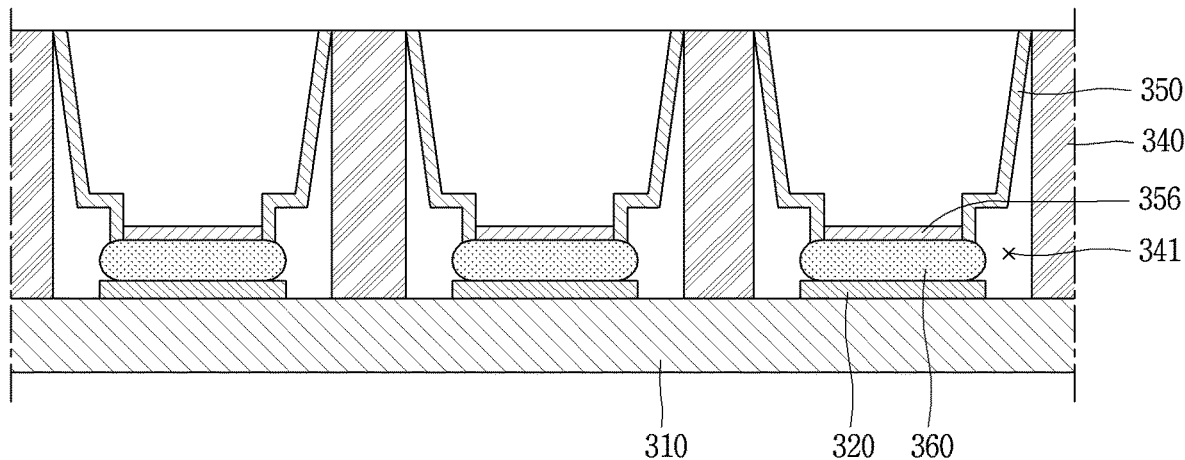

FIGS. 20A to 20C are cross-sectional views illustrating a method of fabricating the display device according to the present disclosure.

As illustrated in FIG. 20A, after forming the lower electrode 320 and the metal bonding layer 360 on the wiring substrate 310, the flay layer 340 is formed to cover the wiring substrate 310, the lower electrode 320, and the metal bonding layer 360.

Then, a plurality of holes 341 is formed at positions corresponding to the respective metal bonding layers 360 through hole processing. Accordingly, the metal bonding layer 360 is exposed to the outside.

Meanwhile, the lower electrode 320 includes the magnetic portion that generates an electric force or a magnetic force, as aforementioned.

Then, as shown in FIG. 20B, a dispersion liquid of the light-emitting devices 350 is applied onto the wiring substrate 310 coated with the metal bonding layer 360. When the dispersion liquid is applied, an attractive force is formed between the magnetic portion provided at the lower electrode 320 and the reaction portion provided at each of the light-emitting devices 350. Accordingly, the light-emitting devices 350 are inserted into the hole 341, and are then adhered to the metal bonding layer 360, as illustrated in FIG. 20C. Each of the light-emitting devices 350 is electrically connected to the lower electrode 320 through the metal bonding layer 360.

When the light-emitting devices are transferred in this manner, it is not necessary to individually pick and place the light-emitting devices onto the electrode.

Figure 21:
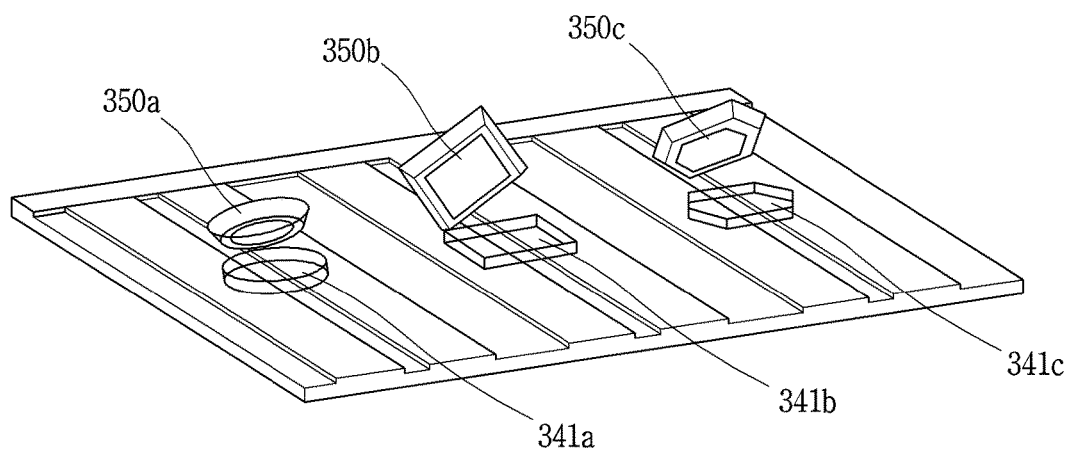
FIG. 21 is a conceptual view illustrating a transfer process using holes having different shapes.

Meanwhile, as illustrated in FIG. 21, when shapes of holes 341a, 341b and 341c are formed differently, a light-emitting device having a specific shape may be attached or adhered to a specific position. In more detail, the plurality of holes may include a first hole 341a having a first shape and a second hole 341b having a different shape from the first shape, and a third hole 341c having a different shape from the first shape and the second shape.

A first light-emitting device 350a corresponding to the first shape may be only disposed on the first hole 341a, a second light-emitting device 350b corresponding to the second shape may be only disposed on the second hole 341b, and a third light-emitting device 350c corresponding to the third shape may be only disposed on the third hole 341c. In case holes are formed into three types of shapes, a dispersion liquid mixed of the three different types of light-emitting devices is applied, thereby allowing transfer of R, G, and B light-emitting devices to be performed at once.

Although preferred embodiments have been depicted and described in detail herein, it will be apparent to those skilled in the relevant art that various modifications, additions, substitutions and the like can be made without departing from the spirit of the disclosure, and these are, therefore, considered to be within the scope of the disclosure, as defined in the following claims.

The invention claimed is:

1. A display device, comprising:
a lower substrate on which a lower electrode is disposed;
a flat layer disposed on the lower substrate and having a plurality of holes;
a plurality of light-emitting devices respectively disposed in the plurality of holes;
a magnetic portion disposed on the lower substrate and having a magnetic property; and a reaction portion disposed at each of the plurality of light-emitting devices and forming an attractive force with the magnetic portion, wherein a magnetization direction of the magnetic portion is perpendicular to the lower substrate, and wherein the magnetic portion is made of an Sm—Co alloy.

2. The display device of claim 1, wherein the magnetic portion is made of a ferromagnetic material, and the reaction portion is made of a paramagnetic material.

3. The display device of claim 2, wherein each of the plurality of light-emitting devices comprises:

a first electrode electrically connected to the lower electrode and having a plurality of layers;

a first conductive semiconductor layer disposed on the first electrode;

an active layer disposed on the first conductive semiconductor layer; and a second conductive semiconductor layer disposed on the active layer, and wherein the reaction portion is any one of the plurality of layers constituting the first electrode.

4. The display device of claim 3, wherein the plurality of layers comprise:

a first metal layer in contact with the first conductive semiconductor layer; and a second metal layer in contact with the lower electrode, and wherein the reaction portion is disposed between the first metal layer and the second metal layer.

5. The display device of claim 4, wherein the reaction portion is made of any one of Ni, Fe, Mo, and Co, or an Ni—Mo—Fe alloy or an Ni—Cr—Mo—Fe alloy.

6. The display device of claim 4, wherein a resistivity of the first and second metal layers is less than a resistivity of the reaction portion.

7. The display device of claim 1, wherein the lower electrode includes a plurality of layers, and wherein the magnetic portion is any one of the plurality of layers constituting the lower electrode.

8. The display device of claim 7, wherein a thickness of the magnetic portion is 20 to 1000 nm.

9. The display device of claim 1, wherein the magnetic portion is disposed to overlap each of the plurality of holes.

10. The display device of claim 1, wherein the plurality of holes and the plurality of light-emitting devices have matching shapes.

11. The display device of claim 1, further comprising a metal bonding layer disposed in each of the plurality of holes.

12. The display device of claim 3, wherein the magnetic portion is disposed between the first electrode and the first conductive semiconductor layer.

13. The display device of claim 1, wherein the flat layer is formed of a molding material.

14. The display device of claim 13, further comprising a plurality of position partition walls interspersed between the plurality of light-emitting devices.

15. The display device of claim 1, wherein shapes of the plurality of holes are one of circular, rectangular and polygonal.

16. The display device of claim 15, wherein shapes of the plurality of light-emitting devices are different.

17. The display device of claim 1, further comprising a plurality of lower electrodes extending parallel on the lower substrate, wherein the plurality of light-emitting devices are aligned over the plurality of lower electrodes.

18. The display device of claim 1, wherein the magnetic portion includes a first magnetic portion and a second magnetic portion, and wherein the first magnetic portion and the second magnetic portion are respectively disposed on opposite surfaces of the lower substrate.

19. A display device, comprising:

a substrate on which a lower electrode is disposed;

a plurality of light-emitting devices disposed on the substrate;

a layer disposed on the substrate and having a plurality of holes having matching shape as the plurality of light-emitting devices;

a magnetic portion disposed on the substrate and having a magnetic property; and a reaction portion disposed at each of the plurality of light-emitting devices and forming an attractive force with the magnetic portion, wherein a magnetization direction of the magnetic portion is substantially perpendicular to the substrate, and wherein the magnetic portion is made of an Sm—Co alloy.

* * * * *